(12) United States Patent
Kao et al.

(10) Patent No.: US 12,369,389 B2
(45) Date of Patent: Jul. 22, 2025

(54) INTEGRATED CIRCUIT IN HYBRID ROW HEIGHT STRUCTURE

(71) Applicant: TAIWAN SEMICONDUCTOR MANUFACTURING CO., LTD., Hsinchu (TW)

(72) Inventors: Jerry Chang-Jui Kao, Taipei (TW); Hui-Zhong Zhuang, Kaohsiung (TW); Li-Chung Hsu, Hsinchu (TW); Sung-Yen Yeh, Pingtung County (TW); Yung-Chen Chien, Kaohsiung (TW); Jung-Chan Yang, Taoyuan (TW); Tzu-Ying Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/361,722

(22) Filed: Jul. 28, 2023

(65) Prior Publication Data
US 2023/0377976 A1    Nov. 23, 2023

Related U.S. Application Data

(60) Continuation of application No. 17/831,110, filed on Jun. 2, 2022, now Pat. No. 11,791,213, which is a (Continued)

(51) Int. Cl.
*H10D 84/03* (2025.01)
*H01L 21/48* (2006.01)
(Continued)

(52) U.S. Cl.
CPC ....... *H10D 84/038* (2025.01); *H01L 21/4828* (2013.01); *H01L 23/50* (2013.01); *H01L 23/535* (2013.01); *H10D 88/01* (2025.01)

(58) Field of Classification Search
CPC ............ H01L 21/8221; H01L 21/4828; H01L 23/50; H01L 23/535; H01L 23/528;
(Continued)

(56) References Cited

U.S. PATENT DOCUMENTS

| 5,666,288 A | 9/1997 | Jones |
| 6,505,323 B1 | 1/2003 | Lipton |

(Continued)

FOREIGN PATENT DOCUMENTS

| CN | 103455654 A | 12/2013 |
| CN | 110046369 A | 7/2019 |

(Continued)

OTHER PUBLICATIONS

Claas Cornelius et al., "Encountering Gate Oxide Breakdown with Shadow Transistors to Increase Reliability", 21st Annual Symposium on Integrated Circuits and Systems Design, SBCCI 2008, Gramado, Sep. 3, 2008, pp. 1-22.

(Continued)

*Primary Examiner* — Duy T Nguyen
(74) *Attorney, Agent, or Firm* — Maschoff Brennan

(57) ABSTRACT

An integrated circuit is provided and includes first transistors of a first circuit arranged in a first cell row having a first number of fin structures and a second transistor of a second circuit. The second transistor is coupled in parallel with a first element in the first transistors between first and second terminals of the first circuit, and arranged in a second cell row having a second number, different from the first number, of fin structures. The first element and the second transistor share a first gate extending in a first direction to pass through the first and second cell rows in a layout view. The second transistor is a duplication of the first element.

20 Claims, 19 Drawing Sheets

Related U.S. Application Data division of application No. 16/882,103, filed on May 22, 2020, now Pat. No. 11,355,395.

(51) Int. Cl.
    *H01L 23/50*     (2006.01)
    *H01L 23/535*     (2006.01)
    *H10D 88/00*     (2025.01)

(58) Field of Classification Search
    CPC .............. H01L 27/0207; H01L 27/092; H01L 27/0886; H01L 27/088; G06F 30/392; G06F 30/394; G06F 2115/06; H10D 84/038; H10D 88/01; H10D 84/135; H10D 12/01; H10F 30/2863; H10F 77/955
    USPC ........................................................ 257/66
    See application file for complete search history.

(56) References Cited

U.S. PATENT DOCUMENTS

| | | | |
|---|---|---|---|
| 8,610,241 B1 * | 12/2013 | Hu | H01L 27/0635 |
| | | | 257/353 |
| 9,263,257 B2 | 2/2016 | Chien et al. | |
| 9,502,351 B1 | 11/2016 | Sahu | |
| 9,748,236 B1 * | 8/2017 | Chang | H01L 27/0886 |
| 9,793,174 B1 | 10/2017 | Huang et al. | |
| 11,011,545 B2 | 5/2021 | Guo | |
| 2009/0094568 A1 | 4/2009 | Shukla | |
| 2013/0328162 A1 * | 12/2013 | Hu | H01L 27/0635 |
| | | | 257/E29.174 |
| 2014/0197463 A1 | 7/2014 | Gan et al. | |
| 2014/0363960 A1 * | 12/2014 | Kim | H01L 21/82345 |
| | | | 438/585 |
| 2015/0048424 A1 | 2/2015 | Tien | |
| 2015/0102426 A1 | 4/2015 | Flachowsky et al. | |
| 2017/0116365 A1 | 4/2017 | Cheng et al. | |
| 2017/0373090 A1 * | 12/2017 | Correale, Jr. | G06F 30/392 |
| 2018/0151451 A1 * | 5/2018 | Li | H01L 27/0924 |
| 2019/0065650 A1 | 2/2019 | Pelloie | |
| 2019/0148407 A1 | 5/2019 | Guo et al. | |
| 2019/0164949 A1 | 5/2019 | Sio et al. | |
| 2019/0287967 A1 * | 9/2019 | Liaw | H01L 27/0207 |
| 2019/0355719 A1 * | 11/2019 | Maeda | H01L 29/0607 |
| 2020/0019667 A1 | 1/2020 | Lin et al. | |
| 2020/0051977 A1 | 2/2020 | Lim et al. | |
| 2020/0057830 A1 | 2/2020 | Azmat et al. | |
| 2020/0058681 A1 * | 2/2020 | Lai | H01L 27/1211 |
| 2020/0134119 A1 | 4/2020 | Sio | |
| 2020/0402968 A1 | 12/2020 | Zhuang et al. | |
| 2021/0117603 A1 | 4/2021 | Jiang | |

FOREIGN PATENT DOCUMENTS

| | | |
|---|---|---|
| CN | 110660800 A | 1/2020 |
| CN | 110828450 A | 1/2020 |
| CN | 111129000 A | 5/2020 |
| DE | 102019113506 A1 | 2/2020 |
| DE | 102020111749 A1 | 12/2020 |
| KR | 20170104043 A | 9/2017 |
| KR | 20190062312 A | 6/2019 |
| KR | 20200008526 A | 1/2020 |
| KR | 20200020262 A | 2/2020 |
| TW | 201506529 A | 2/2015 |

OTHER PUBLICATIONS

Coventor(a Lam Research company), "Intel Announces Production-Ready 22nm 3-D Tri-Gate Transistor", published on May 5, 2011, retrieved form the Internet: https://www.coventor.com/blog/intel-announces-production-ready-22nm-3-d-tri-gate-transistor/ on Sep. 3, 2021.

* cited by examiner

INTEGRATED CIRCUIT IN HYBRID ROW HEIGHT STRUCTURE

CROSS REFERENCE

This application is a continuation application of U.S. application Ser. No. 17/831,110, filed Jun. 2, 2022, now U.S. Pat. No. 11,791,213, issued on Oct. 17, 2023, which is a divisional application of U.S. application Ser. No. 16/882,103, filed on May 22, 2020, now U.S. Pat. No. 11,355,395, issued on Jun. 7, 2022, which is herein incorporated by reference in its entirety.

BACKGROUND

Integrated circuits have been widely used for various kinds of applications, and the demand for faster processing speed and lower power consumption is increasing. However, the gate oxide breakdown highly influences the performance and the reliability of the integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
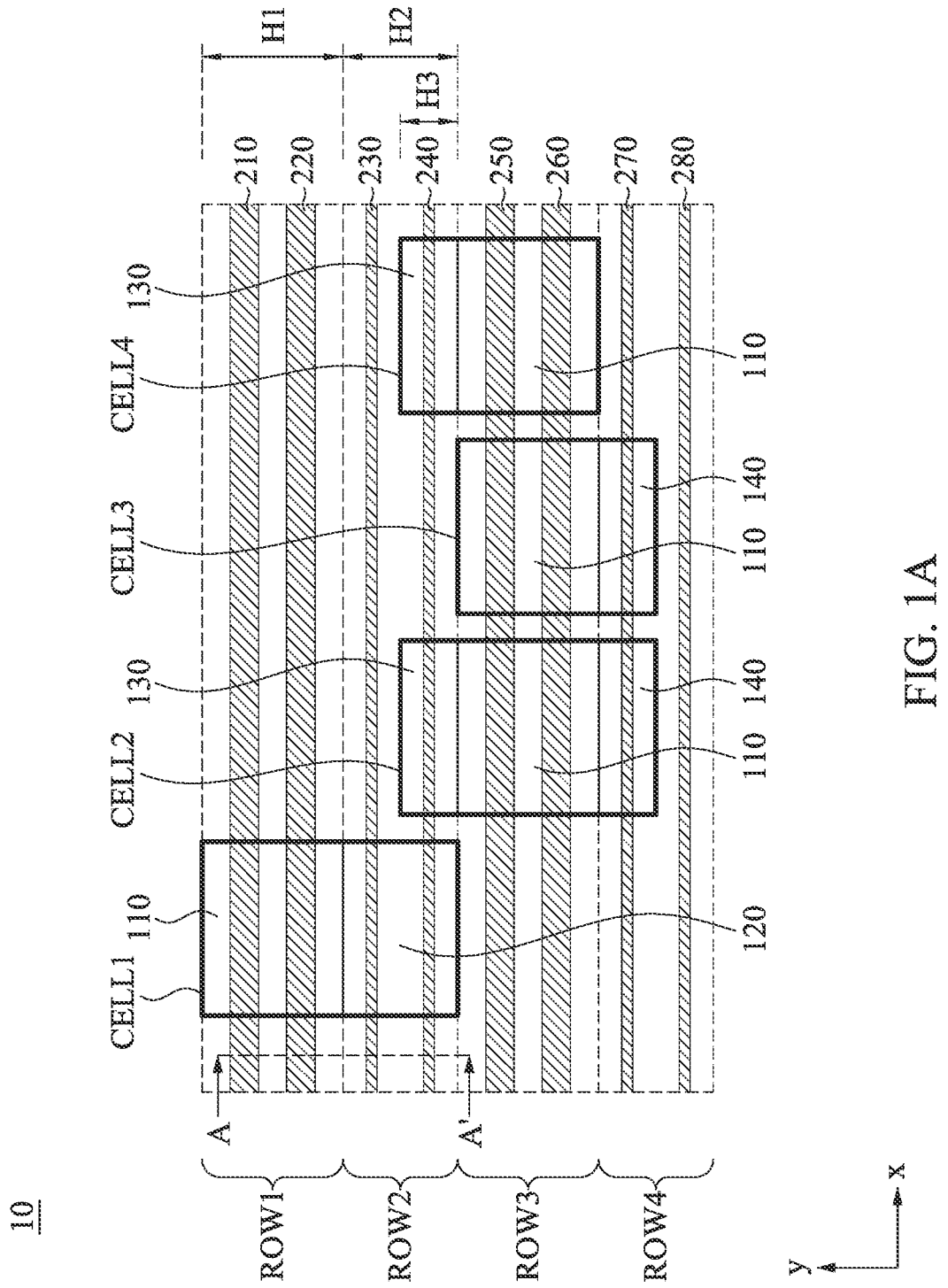
FIG. 1A is a top view diagram of part of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1A. FIG. 1A is a top view diagram of part of a semiconductor device, in accordance with some embodiments. As illustratively shown in FIG. 1A, the semiconductor device 10 includes several cell rows ROW1-ROW4 and cells CELL1-CELL4. In some embodiments, the cells CELL1-CELL4 are implemented by integrated circuits arranged in these cell rows ROW1-ROW4. In some embodiments, each of the cells CELL1-CELL4 is implemented as a logic gate circuit including AND, OR, NAND, MUX, Flip-flop, Latch, BUFF, inverter, the combination thereof, or any other types of logic circuit. The number of the cell rows ROW1-ROW4 in the semiconductor device 10 in FIG. 1A is given for illustrative purposes. Various numbers of the cell rows ROW1-ROW4 are within the contemplated scope of the present disclosure. For example, in some embodiments, the number of the cell rows in the semiconductor device 10 is more than 4.

For illustration, the cell rows ROW1-ROW4 extends along x direction and are parallel to each other. In some embodiments, the cell rows ROW1-ROW4 are arranged along y direction, which is substantially perpendicular to the x direction.

In some embodiments, there are two groups of cell rows among the rows ROW1-ROW4 in reference with their row heights. As illustratively shown in FIG. 1A, each of the cell rows ROW1 and ROW3 is configured to have a row height H1, and each of the cell rows ROW2 and ROW4 is configured to have another row height H2, which is shorter than the row height H1. The cell rows ROW1 and ROW3 with the row height H1 are regarded as a first group "A" of the cell rows ROW1-ROW4, and the cell rows ROW2 and ROW4 are regarded as a second group "B" of the cell rows ROW1-ROW4. In some embodiments, as depicted in FIG. 1A, the first group A of the cell rows and the second group B of the cell rows are interlaced.

For illustration, the cell row ROW1 with the row height H1 in the first group "A" includes two active areas 210-220, and the cell row ROW2 with the row height H2 in the second group "B" includes two active areas 230-240. Similarly, the cell row ROW3 includes two active areas 250-260, and the cell row ROW4 includes two active areas 270-280. For illustration, the active areas 210-280 extend along x direction and are separate from each other in y direction. The configurations of the active areas 210-280 will be discussed in the following paragraphs with FIG. 2.

In some embodiments, the active areas 210 and 240 have a conductivity of P type, while the active areas 220 and 230 have a conductivity of N type. The configurations of the active areas 250 and 280 are similar to the active areas 210 and 240, and the configurations of the active areas 260 and 270 are similar to the active areas 220 and 230. Alternatively stated, the cell rows ROW1-ROW4 are interlaced in a periodic sequence along y direction. The configurations of the active areas 210-280 are given for illustrative purposes. Various implements of the active areas 210-280 are included in the contemplated scope of the present disclosure. For example, in some embodiments, the active areas 210, 240, 250, and 280 are N type and the active areas 220, 230, 260 and 270 are P type.

As illustratively shown in FIG. 1A, the cell CELL1 includes sub-cells 110 and 120. The sub-cells 110 and 120 abut each other along y direction. The sub-cells 110 and 120 are arranged in the cell rows ROW1 and ROW2 respectively. The sub-cell 110 includes the active areas 210-220, and the sub-cell 120 includes the active areas 230-240.

In some embodiments, the sub-cell 110 includes a logic gate circuit including AND, OR, NAND, MUX, Flip-flop, Latch, BUFF, inverter, or any other types of logic circuit, while the sub-cell 120 includes a shadow logic gate circuit. In such embodiments, the shadow logic gate circuit and at least one circuit component included in the sub-cell 110 have the same operation configurations. For example, in some embodiments, the sub-cell 110 includes several N type transistors and P type transistors. The sub-cell 120 includes a P type transistor coupled in parallel to a corresponding one of the P type transistors of the sub-cell 110 and a N type transistor coupled in parallel to a corresponding one of the N type transistors of the sub-cell 110. The P type transistor in sub-cell 120 and the corresponding one of the P type transistors of sub-cell 110 are configured to cooperate in response to a first signal at gates thereof, while the N type transistor in sub-cell 120 and the corresponding one of the N type transistors of sub-cell 110 are configured to cooperate in response to a second signal at gates thereof. Alternatively stated, the circuit component(s) in sub-cell 120 is(are) configured as a duplication(s) of a corresponding one(s) component in sub-cell 110 to operate with same configuration. The details of sub-cells 110-120 will be discussed with FIGS. 3A-3D, and 7A-7C as examples.

As discussed above, the cell CELL1 operates while the sub-cell 110 is configured as the main logic circuit and the sub-cell 120 is configured as the shadow logic circuit. In some approaches, the semiconductor device includes shadow logic circuit corresponding to sub-cell 120 having transistors, coupled to main logic circuit corresponding to sub-cell 110, to extend cell lifetime. However, because of cell base design rectangle shape nature, the shadow logic circuit and the main logic circuit of some approaches are arranged in the same cell row under a single cell row height architecture (SCRHA) and abut with each other in a direction which the cell rows extend. In such arrangements, it results in not only large area overhead but also poor cell performance due to larger pin cap.

With the configurations of mixed cell row heights of the present disclosure, the shadow logic circuit in the sub-cell 120 is arranged in a reduced height cell row while the main logic circuit in the sub-cell 110 is arranged in a normal height cell row. In such embodiments, if an oxide failure happens to a transistor, for example, at gate of the transistor, in the sub-cell 110, a corresponding redundant transistor, coupled to that transistor in the sub-cell 110, in the sub-cell 120 is still capable to function to maintain the circuit operations. Therefore, not only is the improved reliability provided by the shadow logic circuit in the sub-cell 120, the configurations of the aforementioned mix cell row height architect (MCRHA) has smaller area overhead and smaller pin cap overhead, compared with some approaches. Alternatively stated, the mix cell row architecture of the present disclosure possess advantages in smaller core area while keeping high possibility to persist identical performance to the single cell row height architecture.

The configurations of the cell CELL1 of FIG. 1A are given for illustrative purposes. Various embodiments of the cell CELL1 are includes in the contemplated scope of the present disclosure. For example, in some embodiments discussed in the following paragraphs, a cell corresponding to the sub-cell 120 includes only P type transistors or N type transistors.

With continued reference to FIG. 1A, for illustration, the semiconductor device 10 includes a cell CELL2. Compared with the cell CELL1, instead of including the N type active area 230 and the P type active area 240 in the same cell row ROW2, the cell CELL2 includes the active area 240 in a portion, having a height H3, of the cell ROW2 and the active area 270 in a portion, having the height H3, of the cell row ROW4. The cell CELL2 also includes the active areas 250-260 in the cell row ROW3 interposed between the cell rows ROW2 and ROW4.

As illustratively shown in FIG. 1A, the cell CELL2 includes the sub-cell 110, and further sub-cells 130-140. The sub-cell 110 is interposed between and abuts the sub-cells 130 and 140. The sub-cell 110 is arranged in the cell row ROW3. The sub-cells 130 and 140 are arranged in the cell rows ROW2 and ROW4 respectively. Alternatively stated, the sub-cells 130-140 are arranged on the opposite sides of the sub-cell 110.

The sub-cell 110 includes the active areas 250-260. The sub-cell 130 includes the active area 240, and the sub-cell 140 includes the active area 270. As discussed above, in some embodiments, the active areas 240-250 are P type and the active areas 260-270 are N type.

In some embodiments, the sub-cell 130 includes shadow logic P type devices including, for example, one or more transistors corresponding to P type transistors in sub-cell 110. The sub-cell 140 includes shadow logic N type devices including, for example, one or more transistors corresponding to N type transistors in sub-cell 110. Alternatively stated, compared with the cell CELL1, the sub-cell 120 is implemented by two sub-cells 130-140 arranged on the opposite sides of sub-cell 110, the sub-cell 130 including the P type transistors of the sub-cell 120 and the sub-cell 140 including the N type transistors of the sub-cell 120. In such embodiments, the cell CELL2 operates while the sub-cell 110 is configured as the main logic circuit and the sub-cells 130-140 are configured as separated shadow logic circuit.

With continued reference of FIG. 1A, for illustration, the semiconductor device 10 includes a cell CELL3. Compared with the cell CELL2, instead of having both the sub-cells 130-140, the cell CELL3 includes only the sub-cell 140. In some embodiments, the cell CELL3 operates while the sub-cell 110 is configured as the main logic circuit and the sub-cell 140 is configured as the shadow logic circuit having N type transistors.

Furthermore, the semiconductor device 10 includes a cell CELL4. Compared with the cell CELL2, instead of having both the sub-cells 130-140, the cell CELL4 includes only the sub-cell 130. In some embodiments, the cell CELL4 operates while the sub-cell 110 is configured as the main logic circuit and the sub-cell 130 is configured as the shadow logic circuit having P type transistors.

In some embodiments, a simulation is conducted to identify the most vulnerable transistor(s), and accordingly redundant transistors are inserted in the shadow logic circuit (i.e., in the sub-cells 120-140 in FIG. 1A) to couple with the vulnerable transistor(s). Based on a number of the redundant transistors, one of layout configurations (i.e., the cells CELL1-CELL4 or any other suitable layout structure) is determined for an integrated circuit formed on the semiconductor device. The method 900 of identifying the transistors and determining the layout configuration will be discussed in detail in the later paragraphs with FIG. 9.

Figure 1B:
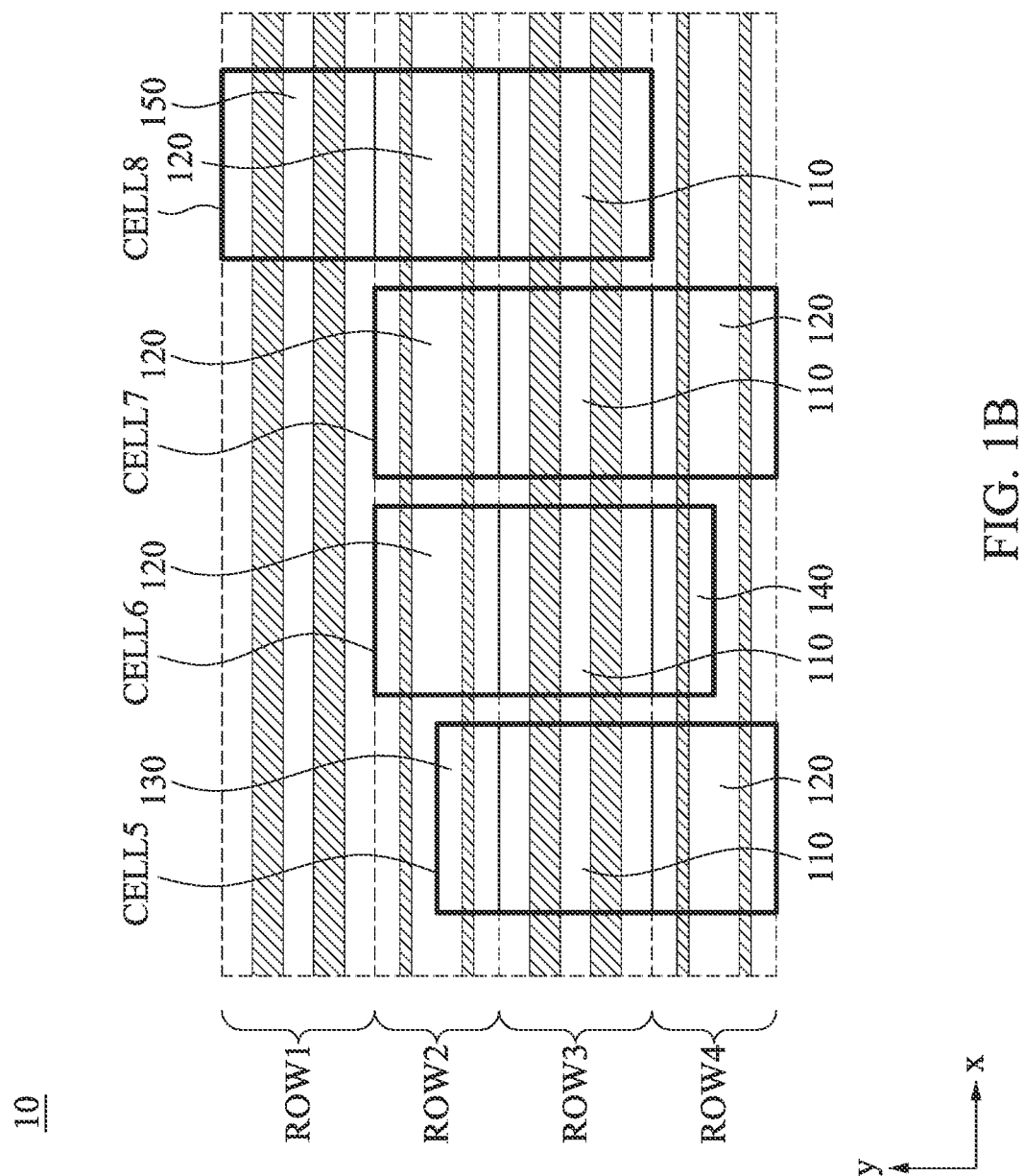
FIG. 1B is a top view diagram of part of the semiconductor device in FIG. 1A, in accordance with various embodiments.

Reference is now made to FIG. 1B. FIG. 1B is a top view diagram of part of the semiconductor device 10 in FIG. 1A, in accordance with various embodiments. With respect to the embodiments of FIG. 1A, like elements in FIG. 1B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 1B.

For illustration, the semiconductor device 10 further includes cells CELL5-CELL8. In some embodiments, each of the cells CELL5-CELL8 is implemented as a logic gate circuit including AND, OR, NAND, MUX, Flip-flop, Latch, BUFF, inverter, the combination thereof, or any other types of logic circuit. In some embodiments, the cells CELL5-CELL8 are implemented by assembling some of the sub-cells 110-140 and a sub-cell 150 along y direction. In some embodiments, the sub-cells 110 and 150 have the same configuration. In some alternative embodiments, the sub-cells 110 and 150 have different configurations.

Specifically, compared with the cell CELL2 of FIG. 1A, instead of having the sub-cell 140, the cell CELL5 includes the sub-cell 120 arranged in the cell row ROW4. For illustration, the sub-cell 110 is interposed between the sub-cells 120-130. Accordingly, there are more P type active areas than N type active areas in the cell CELL5 to form P type transistors in shadow logic circuit.

Compared with the cell CELL5, instead of having more P type active areas than N type active areas, the cell CELL6 includes the sub-cell 120 arranged in the cell row ROW2 and the sub-cell 140 arranged in the cell row ROW4. Accordingly, there are more N type active areas than P type active areas in the cell CELL6 to form N type transistors in the shadow logic circuits.

For illustration, compared with the cells CELL5 and CELL6 that have asymmetric numbers of N type and P type active areas in the shadow logic circuits, the cell CELL7 includes two sub-cells 120 arranged on the opposite sides of the sub-cell 110. In such embodiments, the cell CELL7 has double shadow logic circuits in respect to the cell CELL1 of FIG. 1A. Accordingly, the reliability of the circuit formed with the configuration of the cell CELL7 increases.

The configurations of FIGS. 1A-1B are given for illustrative purposes. Various implements are included in the contemplated scope of the present disclosure. For example, the semiconductor device 10 further includes a cell having the sub-cell 110 arranged in the cell row ROW3 and a sub-cell which abuts the sub-cell 110 along y direction and extends in x direction, having a width wider than a width of the sub-cell 130 of FIG. 1A. Accordingly, more P redundant transistors are allowed to be formed in the sub-cell for operation.

Figure 2:
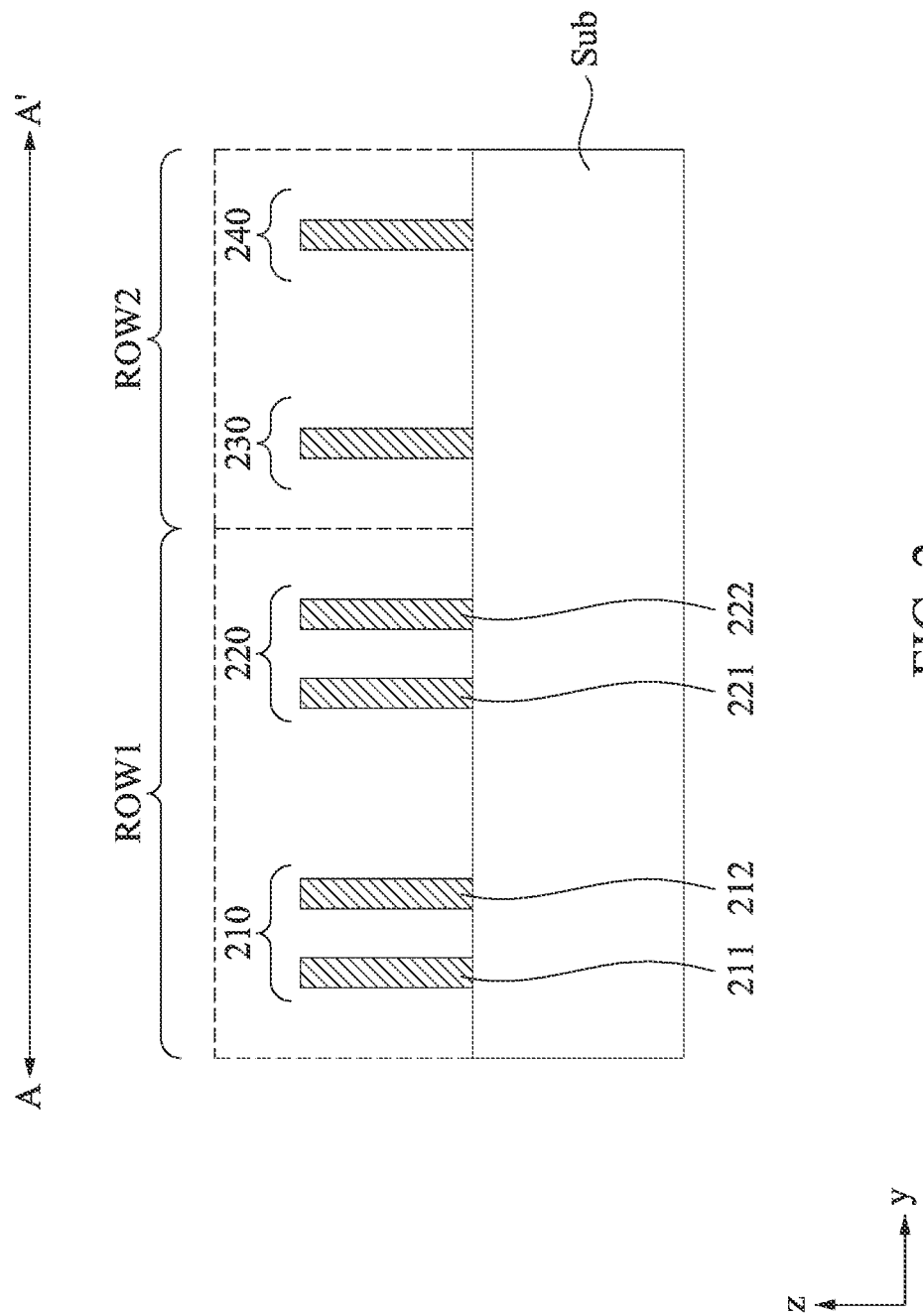
FIG. 2 is a sectional view diagram illustrating a structure of some cell rows along a sectional line in FIG. 1A in accordance with some embodiments.

Reference is now made to FIG. 2. FIG. 2 is a sectional view diagram illustrating a structure of the cell rows ROW1-ROW2 along a sectional line AA' in FIG. 1A in accordance with some embodiments. With respect to the embodiments of FIG. 1A, like elements in FIG. 2 are designated with the same reference numbers for ease of understanding.

As illustratively shown in FIG. 2, the cell row ROW1 with the row height H1 in the first group "A" includes the active areas 210-220 on a substrate Sub. The active area 210 of the cell row ROW1 includes two fin-shaped structures 211 and 212, and the active area 220 of the cell row ROW1 includes another two fin-shaped structures 221 and 222. Alternatively stated, each one of the active areas 210-220 include two fin-shaped structures, such as 211 and 212, or 221 and 222.

In some embodiments, the fin-shaped structures 211 and 212 are n-type fin-shaped structures, and the fin-shaped structures 221 and 222 are p-type fin-shaped structures. In some other embodiments, the fin-shaped structures 211 and 212 are p-type fin-shaped structures, and the fin-shaped structures 221 and 222 are n-type fin-shaped structures.

As illustratively shown in FIG. 2, the cell row ROW2 with the row height H2 in the second group "B" includes two active areas 230-240 on the substrate Sub. The active area 230 of the cell row ROW2 includes a first one fin-shaped structure, and the active area 240 of the cell row ROW2 includes a second one fin-shaped structure. Alternatively stated, each one of the active areas 230-240 include one fin-shaped structure.

The fins mentioned above may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In some embodiments, such an active area may include one or more fin-shaped structures of one or more three-dimensional field-effect-transistors (e.g., FinFETs, gate-all-around (GAA) transistors), or an oxide-definition (OD) region of one or more planar metal-oxide-semiconductor field-effect transistors (MOSFETs). The active region may serve as a source feature or a drain feature of the respective transistor (s).

In some embodiments, the active area 210 of the cell row ROW1 includes two fin-shaped structures 211 and 212 together as an active region to form an integrated circuit component (such as a transistor), such that an equivalent width of the active region of the integrated circuit component disposed on the active area 210 will be wider than one of another integrated circuit component disposed on the active area 230, which includes the first one fin-shaped structure. Alternatively stated, in some embodiments, integrated circuit components disposed on the cell row ROW1 have a better performance than integrated circuit components disposed on the cell row ROW2.

Figure 3B:
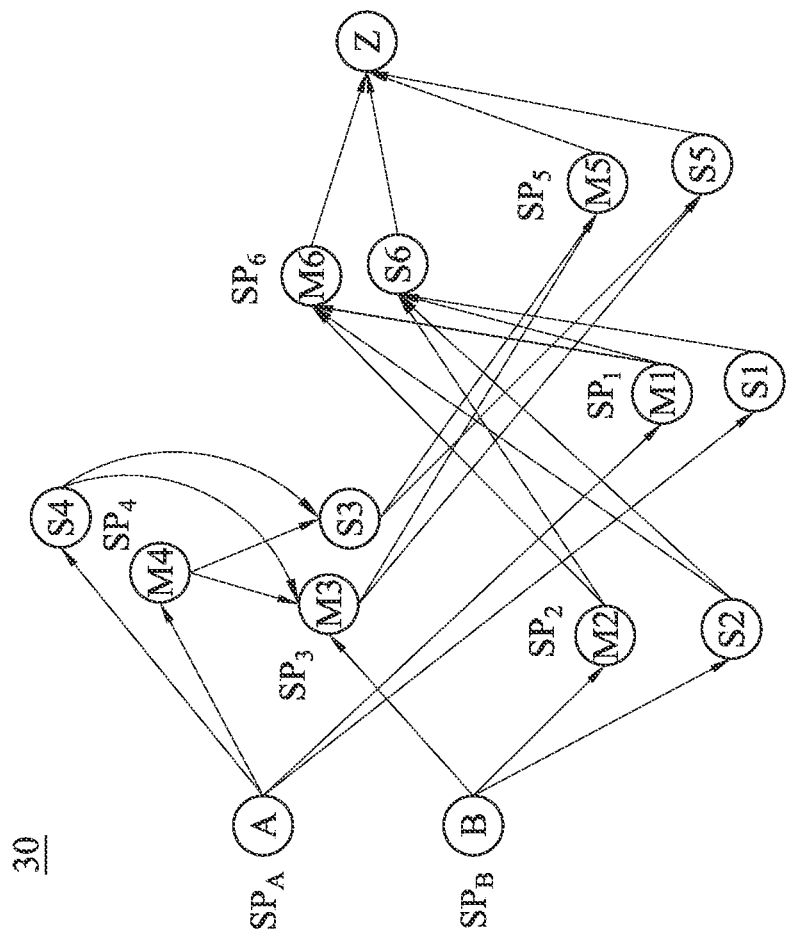
FIG. 3B is a direct acyclic diagram corresponding to the equivalent circuit of part of the integrated circuit in FIG. 3A, in accordance with some embodiments.
Figure 3A:
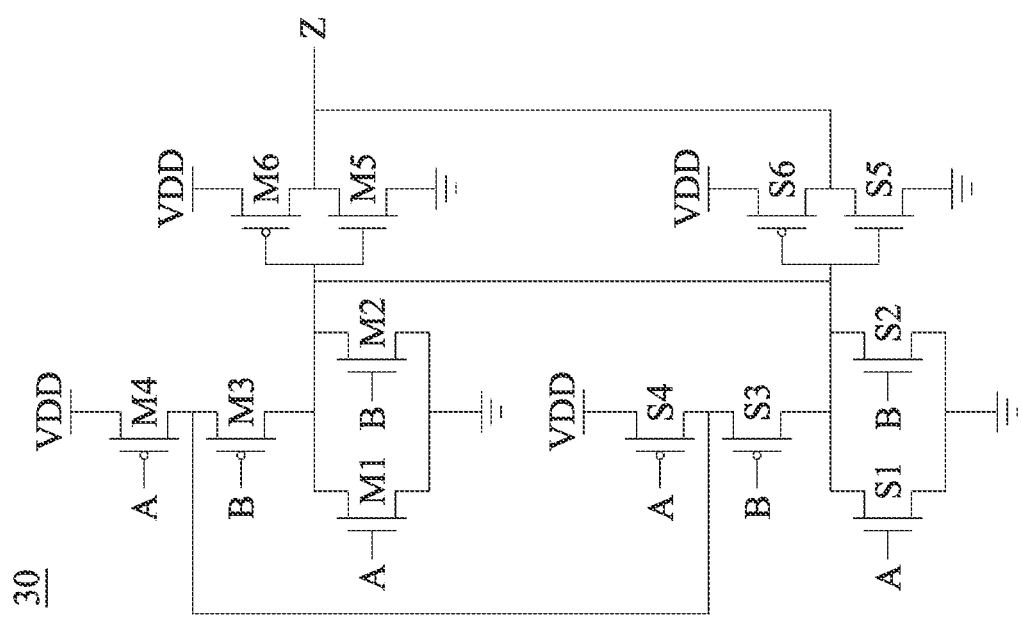
FIG. 3A is an equivalent circuit of part of an integrated circuit including structures corresponding to the semiconductor device in FIG. 1A, in accordance with some embodiments.

Reference is now made to FIGS. 3A-3B. FIG. 3A is an equivalent circuit of part of an integrated circuit 30 including structures corresponding to the semiconductor device 10 in FIG. 1A, in accordance with some embodiments. FIG. 3B is a direct acyclic diagram corresponding to the equivalent circuit of part of the integrated circuit 30 in FIG. 3A, in accordance with some embodiments.

As illustratively shown in FIG. 3A, the integrated circuit 30 includes a first circuit having transistors M1-M6 and a second circuit having transistors S1-S6. The integrated circuit 30 is coupled between a supply voltage VDD and a ground. In some embodiments, the integrated circuit 30 is included in the cell, for example, the cell CELL1 of FIG. 1A, while the first circuit is included in the sub-cell 110 of FIG. 1A and operates as the main logic circuit and the second circuit is included in the sub-cell 120 of FIG. 1A and operates as the shadow logic circuit.

In some embodiments, the transistors M1-M2, M5, S1-S2 and S5 are N type transistors. The transistors M3-M4, M6, S3-S4 and S6 are P type transistors.

Specifically, the transistors M1, M4, S1 and S2 include gates to receive a signal A. The transistors M2, M3, S2 and S3 include gates to receive a signal B. The transistors M1-M2, M5, S1-S2 and S5 include first terminals to be coupled to the ground. The transistors M4, M6, S4 and S6 include first terminals to be coupled to the supply voltage VDD. A second terminal of the transistor M4 is coupled to first terminals of the transistors M3 and S3. A second terminal of the transistor M3 is coupled to a second terminal of the transistor S3, second terminals of the transistors M1-M2, second transistors of the transistors S1-S2, and gates of the transistors M5-M6 and S5-S6. Second terminals of the transistors M5-M6 and S5-S6 are coupled together at an output node Z.

Based on the discussed above, alternatively stated, the transistor S1 is coupled in parallel to the transistor M1, being as a redundant transistor. The relationships between the transistors S2-S6 and the transistor M2-M6 are similar to that of the transistors S1 and M1. Thus, the repetitious descriptions are omitted here.

With reference to FIG. 3B, the direct acyclic diagram shown in FIG. 3B is drawn based on a netlist of the integrated circuit 30 shown in FIG. 3A. For illustration, vertexes marked with "M1-M6" correspond to the transistors M1-M6 of FIG. 3A separately and are referred as vertexes M1-M6 for ease of understanding. Vertexes marked with "S1-S6" correspond to the transistors S1-S6 of FIG. 3A separately and are referred as vertexes S1-S6 for ease of understanding. A vertex marked with "A" corresponds to a pin transmitting the signal A and is referred as a vertex A for ease of understanding, and a vertex marked with B corresponds to a pin transmitting the signal B and is referred as a vertex B for ease of understanding. A vertex marked with "Z" corresponds to a pin coupled to the output node and is referred as a vertex Z for ease of understanding. In some embodiments, the vertexes A and B are independent vertexes. Arrays depicted in FIG. 3B indicate the output and input relationships between two vertexes (i.e., two transistors or a pin and a transistor).

As shown in FIG. 3B, the vertex A being connected to the vertexes M1, S1, M4, and S4 denotes that the signal A is output to inputs of the transistors M1, S1, M4, and S4. The vertexes M4 and S4 being connected to the vertexes M3 and S3 denotes that the outputs of the transistors M4 and S4 are the inputs of the transistors M3 and S3. Furthermore, the vertexes M3 and S3 being connected to the vertexes M5 and S5 denotes that the outputs of the transistors M3 and S3 are the inputs of the transistors M5 and S5. The vertexes M4 and S4 being connected to the vertex Z denotes that the outputs of transistors M5 and S5 are an input for the pin Z. Alternatively stated, the transistors M3-M4 and S3-S4 are included in the operation of transmitting the supply voltage VDD for manipulating the transistors M5 and S5. In addition, after being connected to the vertex A, the vertexes M1 and S1 being connected to the vertexes M6 and S6 denotes that the outputs of the transistors M1 and S1 are the inputs of the transistors M6 and S6. The vertexes M6 and S6 being connected to the vertex Z denotes that the outputs of transistors M6 and S6 are another input for the pin Z. Alternatively stated, the transistors M1 and S1 are included in the operation of transmitting the ground voltage level for manipulating the transistors M6 and S6.

Moreover, the vertex B being connected to the vertexes M2 and S2 denotes that the signal B is output to inputs of the transistors M2 and S2. The vertexes M2 and S2 being connected to the vertexes M6 and S6 denotes that the outputs of the transistors M2 and S2 are the inputs of the transistors M6 and S6. As mentioned above, the vertexes M6 and S6 being connected to the vertex Z denotes that the outputs of transistors M6 and S6 are another input for the pin Z. Alternatively stated, the transistors M2 and S2 are further included in the operation of transmitting the ground voltage level for manipulating the transistors M6 and S6.

With continued reference to FIG. 3B, values SPA-SPB indicate probabilities of element failures at the pins which receive the signals A and B for the integrated circuit 30. In some embodiments, during the simulation of the netlist of the integrated circuit 30, the pins are rendered without any element failures.

Values $SP_1$-$SP_6$ indicate probabilities of element failures at the transistors M1-M6 separately. In some embodiments, the element failures at the transistors M1-M6 includes, for example, a gate oxide breakdown. The gate oxide breakdown is defined as the point in time when a conducting path is created between the gate and the substrate of a transistor. In some cases, the conducting path originates from a slow destruction over time called time-dependent dielectric breakdown (TDDB). For example, in a chain of events, including, for example, in the operation of the transistor a current flow increasing, heat increasing, thermal damage occurring, more charge traps in the gate oxide, and the conduction increasing. As a result, the gate oxide breakdown is accelerated and results in a failing transistor. Accordingly, based on a simulated result of the netlist of the integrated circuit under some operation parameters, the values $SP_1$-$SP_6$ are obtained and the most vulnerable transistor(s) in the circuit is/are identified. Correspondingly, as mentioned before, one or more redundant transistors are added in the circuit in case the main transistor is failed in operations. The method 900 of identifying the transistors and determining the corresponding layout configuration will be discussed in detail in the later paragraphs with FIG. 9.

Figure 3C:
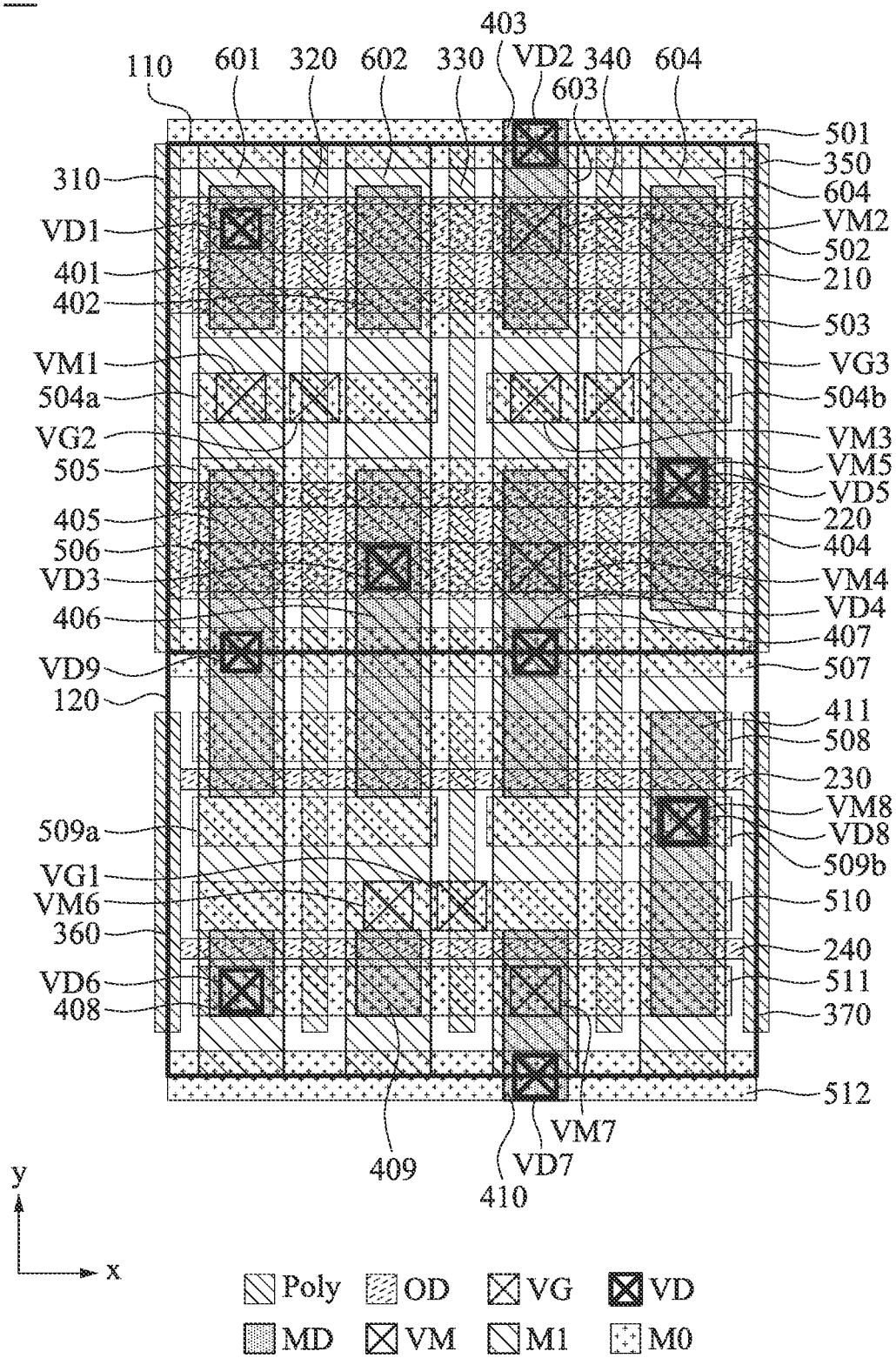
FIG. 3C is a layout diagram in a plan view of part of the integrated circuit corresponding to part of FIG. 3A, in accordance with some embodiments.

Reference is now made to FIG. 3C. FIG. 3C is a layout diagram in a plan view of part of the integrated circuit 30 corresponding to a part of FIG. 3A, in accordance with some embodiments. With respect to the embodiments of FIGS. 1A-3B, like elements in FIG. 3C are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 3C.

For illustration, the integrated circuit 30 includes a layout configuration of the cell CELL1 of FIG. 1A, in which the sub-cell 110 and 120 abut along y direction. As shown in FIG. 3C, the integrated circuit 30 further includes the active areas (i.e., oxide diffusions, OD) 210-240, gates (i.e., poly) 310-370, conductive patterns (i.e., metal-to-devices, MD) 401-411, conductive lines (i.e., metal-zero lines, M0) 501-503, 504a-504b, 505-508, 509a-509b, and 510-512, conductive traces (i.e., metal-one lines, M1) 601-604, and vias VG1-VG3, VD1-VD9, and VM1-VM8 in the sub-cells 110 and 120. In some embodiments, the active areas 210-240 are arranged in a first layer on the substrate Sub of FIG. 2. The gates 310-370 and the conductive patterns 401-411 are arranged in a second layer above the first layer. The conductive lines 501-503, 504a-504b, 505-508, 509a-509b, and 510-512 are arranged in a third layer above the second layer. The conductive traces 601-604 are arranged in a fourth layer above the third layer. The vias VD1-VD9 are arranged between the first and second layers. The vias VG1-VG3 are arranged between the second and third layers. The vias VM1-VM8 are arranged between the third and fourth layers.

With reference to FIGS. 3A and 3C, the active areas 210-220 are configured for the formation of the transistors M1-M6, and the active areas 230-240 are configured for the formation of the transistors S1-S6.

The conductive pattern 401 corresponds to the second terminal of the transistor M3. The conductive pattern 402 corresponds to the first terminal of the transistor M3 and the second terminal of the transistor M4. The conductive pattern 403 corresponds to the first terminals of the transistors M4 and M6. The conductive pattern 404 corresponds to the second terminals of the transistors M5-M6. The conductive pattern 405 corresponds to the first terminals of the transistors M2 and S2. The conductive pattern 406 corresponds to the second terminals of the transistors M1-M2 and S1-S2. The conductive pattern 407 corresponds to the first terminals of the transistors M1, M5, S1, and S5. The conductive pattern 408 corresponds to the second terminal of the transistor S3. The conductive pattern 409 corresponds to the first terminal of the transistor S3 and the second terminal of the transistor S4. The conductive pattern 410 corresponds to the first terminals of the transistors S4 and S6. The conductive pattern 411 corresponds to the second terminals of the transistors S5-S6.

The gates 310, 350-360, and 370 are referred to as dummy gates, in which in some embodiments, the "dummy" gate is referred to as being not electrically connected as the gate for MOS devices, having no function in the circuit.

A first portion of the gate 320 above the active area 210 corresponds to the gate of the transistor M3, a second portion of the gate 320 above the active area 220 corresponds to the gate of the transistor M2, a third portion of the gate 320 above the active area 230 corresponds to the gate of the transistor S2, and a fourth portion of the gate 320 above the active area 240 corresponds to the gate of the transistor S3.

A first portion of the gate 330 above the active area 210 corresponds to the gate of the transistor M4, a second portion of the gate 330 above the active area 220 corresponds to the gate of the transistor M1, a third portion of the gate 330 above the active area 230 corresponds to the gate of the transistor S1, and a fourth portion of the gate 330 above the active area 240 corresponds to the gate of the transistor S4.

A first portion of the gate 340 above the active area 210 corresponds to the gate of the transistor M6, a second portion of the gate 340 above the active area 220 corresponds to the gate of the transistor M5, a third portion of the gate 340 above the active area 230 corresponds to the gate of the transistor S5, and a fourth portion of the gate 340 above the active area 240 corresponds to the gate of the transistor S6.

As illustratively shown in FIG. 3C, the active areas 210-240 extend in x direction and are separate from each other in y direction. As mentioned above, in some embodiments, each of the active areas 210-220 includes the two fin-shaped structures 211 and 212 of FIG. 2, and each the active areas 230-240 include the first and second one fin-shaped structure respectively.

The gates 310-370 extend in y direction and are separate from each other in x direction. Furthermore, the gates 320-340 extend through the sub-cells 110 and 120, and cross the active areas 210-240.

The conductive patterns 401-411 extend in y direction. The conductive patterns 401-403 cross the active area 210. The conductive pattern 404 crosses both the active areas 210-220. The conductive patterns 401-403 cross the active areas 220-230. The conductive patterns 408-410 cross the active area 240. The conductive pattern 401 crosses both the active areas 230-240.

The conductive lines 501-503, 504a-504b, 505-508, 509a-509b, and 510-512 extend in x direction and are separate from each other in y direction. The conductive line 501 crosses the conductive pattern 403 and the gates 310-350. The conductive lines 502-503 cross the conductive patterns 401-404 and the gates 320-340. The conductive line 504a crosses the gate 320, and the conductive line 504b crosses the conductive pattern 404 and the gate 340. The conductive lines 505-507 cross the conductive patterns 405-407 and the gates 320-340, and the conductive lines 505-506 further cross the conductive pattern 404. The conductive line 508 crosses the conductive patterns 405-407 and 411. The conductive line 509a crosses the gate 320, and the conductive line 509b crosses the conductive pattern 411 and the gate 340. The conductive line 510 crosses the conductive pattern 411 and the gates 320-340. The conductive line 511 crosses the conductive patterns 408-411 and the gates 320-340. The conductive line 512 crosses the conductive pattern 410.

The conductive traces 601-604 extend in y direction through the sub-cells 110-120 and are separate from each other in x direction. For illustration, the conductive traces 601-602 cross the conductive lines 502-503, 504a, 505-508, 509a, and 510-511, and cross the conductive lines 501 and 512. The conductive traces 603-604 cross the conductive lines 502-503, 504b, 505-508, 509b, and 510-511, and cross the conductive lines 501 and 512.

The via VD2 couples the conductive pattern 403 to the conductive line 501, and the via VD7 couples the conductive pattern 410 to the conductive line 512. In some embodiments, the conductive lines 501 and 512 output the supply voltage VDD to the conductive patterns 403 and 410 respectively. The vias VD4 and VD9 couple the conductive patterns 405 and 407 to the conductive line 507 respectively. In some embodiments, the conductive line 507 receives a supply voltage VSS (i.e., in the embodiments of FIG. 3A, the ground) for the integrated circuit 30.

Furthermore, the via VD1 couples the conductive pattern 401 to the conductive line 502. The via VM1 couples the conductive line 502 to the conductive trace 603. Firstly, the via VM4 couples the conductive trace 603 to the conductive line 506, and the via VD3 couples the conductive line 506 to the conductive pattern 406. Accordingly, the conductive pattern 401 is coupled to the conductive pattern 406. In other words, the second terminal of the transistor M3 is coupled to the second terminals of the transistors M1-M2 and S1-S2. Secondly, the via VM7 couples the conductive trace 603 to the conductive line 511, and the via VD6 couples the conductive line 511 to the conductive pattern 408. Accordingly, the conductive pattern 401 is further coupled to the conductive pattern 408. In other words, the second terminal of the transistor M3 is coupled to the second terminal of the transistor S3. Thirdly, the via VM3 couples the conductive trace 603 to the conductive line 504b, and the via VG3 coupled the conductive line 504b to the gate 340. Accordingly, the conductive pattern 401 is coupled to the gate 340. In other words, the second terminals of the transistors M1-M3, the second terminals of the transistors S1-S3, and the gates of the transistors M5-M6 and S5-S6 are coupled together.

The via VD5 couples the conductive pattern 404 to the conductive line 505. The via VM5 couples the conductive line 505 to the conductive trace 604. The via VM8 couples the conductive trace 604 to the conductive line 509a. The via VD8 couples the conductive trace 604 to the conductive pattern 411. Accordingly, the conductive pattern 404 is coupled to the conductive pattern 411. In other words, second terminals of the transistors M5-M6 and S5-S6 are coupled together.

In some embodiments, the conductive trace 604 receives the outputs of the transistors M5-M6 and S5-S6 for the output node Z of FIG. 3A.

The via VG1 couples the gate 330 to the conductive line 510. The via VM6 couples the conductive line 510 to the conductive trace 602. In some embodiments, the conductive trace 602 receives the signal A of FIG. 3A for the gate 330. Accordingly, the gates of the transistors M1, M4, S1, and S4 receive the signal A.

The via VG2 couples the gate 320 to the conductive line 504a. The via VM1 couples the conductive line 504a to the conductive trace 601. In some embodiments, the conductive trace 601 receives the signal B of FIG. 3A for the gate 320. Accordingly, the gates of the transistors M2, M3, S2, and S3 receive the signal B.

Figure 3D:
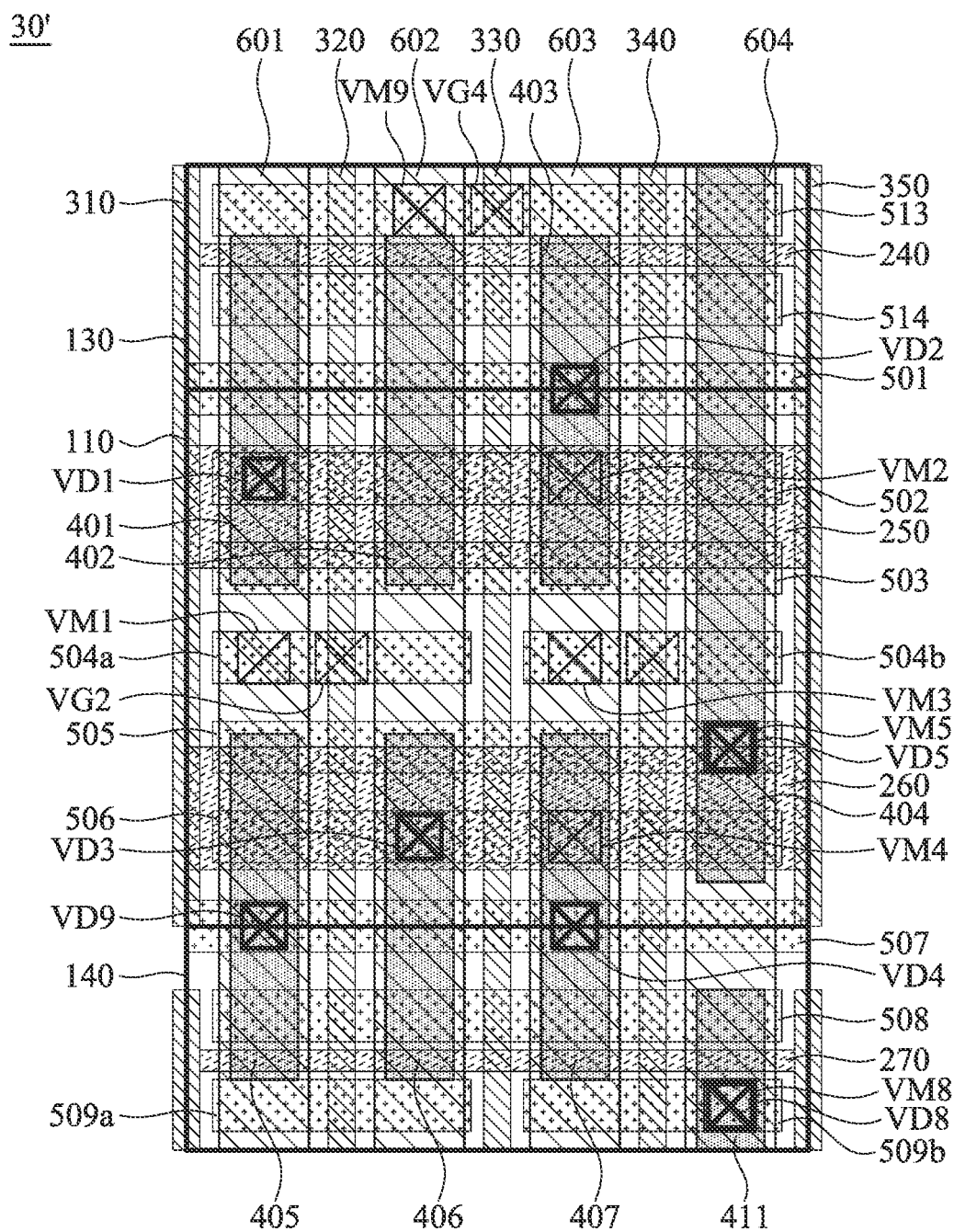
FIG. 3D is another layout diagram in the plan view of part of the integrated circuit corresponding to part of FIG. 3A, in accordance with some embodiments.

Reference is now made to FIG. 3D. FIG. 3D is another layout diagram in the plan view of part of the integrated circuit 30 corresponding to part of FIG. 3A, in accordance with some embodiments. With respect to the embodiments of FIGS. 1A-3C, like elements in FIG. 3D are designated with the same reference numbers for ease of understanding.

The specific operations of similar elements, which are already discussed in detail in above paragraphs, are omitted herein for the sake of brevity, unless there is a need to introduce the co-operation relationship with the elements shown in FIG. 3D.

Compared with FIG. 3C, instead of having the layout configuration of the cell CELL1 of FIG. 1A, the integrated circuit 30' further includes the layout configuration of the cell CELL2 of FIG. 1A, in which the integrated circuit 30' includes the sub-cells 110 and 130-140. As shown in FIG. 3D, instead of having the active areas 210-220, the sub-cell 110 of FIG. 3D includes the active areas 250-260. The sub-cell 130 includes the active areas 240, and the sub-cell 140 includes active area 270. Furthermore, the integrated circuit 30' further includes conductive lines 513-514 and vias VG4 and VM9. In some embodiments, the conductive lines 513-514 are configured with respect to, for example, the conductive lines 510-511. The via VG4 is configured with respect to, for example, the via VG1 of FIG. 3C. The via VM9 is configured with respect to, for example, the via VM6 of FIG. 3C.

In some embodiments, the active areas 210-220 of FIG. 3C and the active areas 250-260 of FIG. 3D have similar configurations, and the configurations of the sub-cell 110 of FIG. 3D are similar to that of FIG. 3C. Thus, the repetitious descriptions are omitted here.

In some embodiments, the active area 270 and the active area 230 of FIG. 3C have similar configuration, and the sub-cell 130 includes the same configuration of metal routing for the active area 230 of FIG. 3C. Accordingly, the relationships between the transistors S1-S2, S5 and the layout structures of FIG. 3D are similar to that of FIG. 3C. Thus, the repetitious descriptions are omitted here.

With reference to FIGS. 3A and 3D, the active area 240 is configured for the formation of the transistors S3-S4 and S6. The conductive pattern 401 further corresponds to the second terminal of the transistor S3. The conductive pattern 402 further corresponds to the first terminal of the transistor S3 and the second terminal of the transistor S4. The conductive pattern 403 further corresponds to the first terminal of the transistors S4 and S6. The conductive pattern 404 further corresponds to the second terminal of the transistor S6. As mentioned above, the portion of the gate 320 above the active area 240 corresponds to the gate of the transistor S3. The fourth portion of the gate 330 above the active area 240 corresponds to the gate of the transistor S4. The fourth portion of the gate 340 above the active area 240 corresponds to the gate of the transistor S6.

For illustration, in the sub-cell 130, the gates 320-340 cross the active area 240. The conductive patterns 401-404 further extend from the sub-cell 110 to cross the active area 240. The conductive line 513 crosses the gates 320-340. The conductive line 514 crosses the conductive patterns 401-404 and the gates 320-340. The conductive traces 601-604 further cross the conductive lines 513-514.

The via VG4 couples the gate 330 to the conductive line 513. The via VM9 couples the conductive line 513 to the conductive trace 602. Accordingly, the gate of the transistor S4 in sub-cell 130 of FIG. 3D further receives the signal A from the conductive trace 602.

As mentioned before, through the vias VD5, VD8, VM5, and VM8, the conductive lines 505, 509b, and the conductive trace 604, the conductive pattern 404 is coupled to the conductive pattern 411. Accordingly, the second terminals of the transistors M5-M6 and S5-S6 are coupled together.

The configurations of FIGS. 3A-3D are given for illustrative purposes. Various implements of FIGS. 3A-3D are within the contemplated scope of the present disclosure. For example, in some embodiments, the active areas 240-250 are N type and the active areas 260-270 are P type.

Figure 4B:
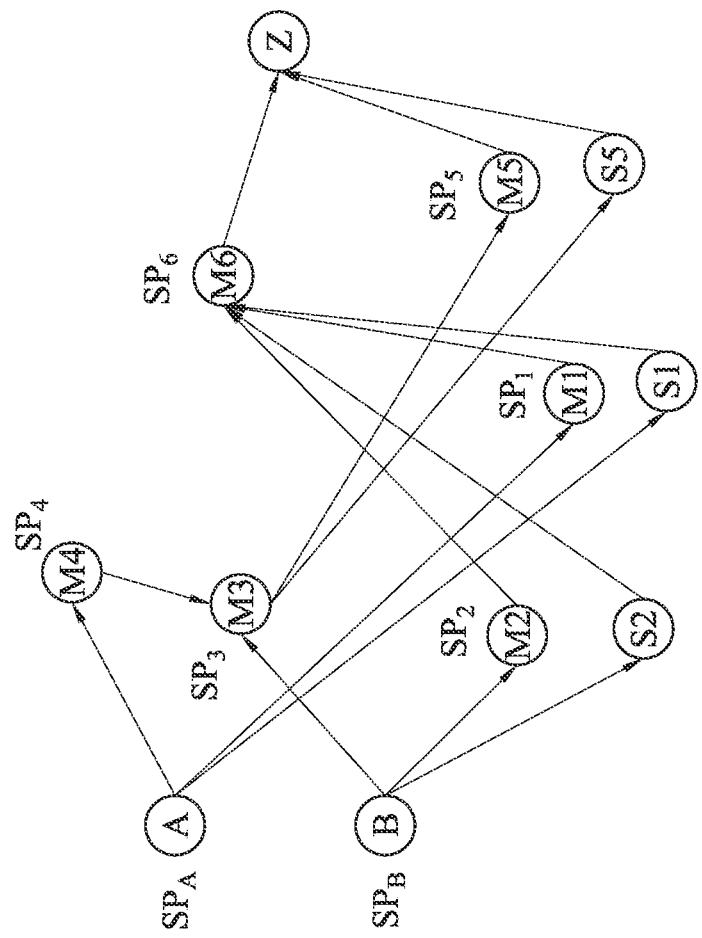
FIG. 4B is a direct acyclic diagram corresponding to the equivalent circuit of part of the integrated circuit in FIG. 4A, in accordance with some embodiments.
Figure 4A:
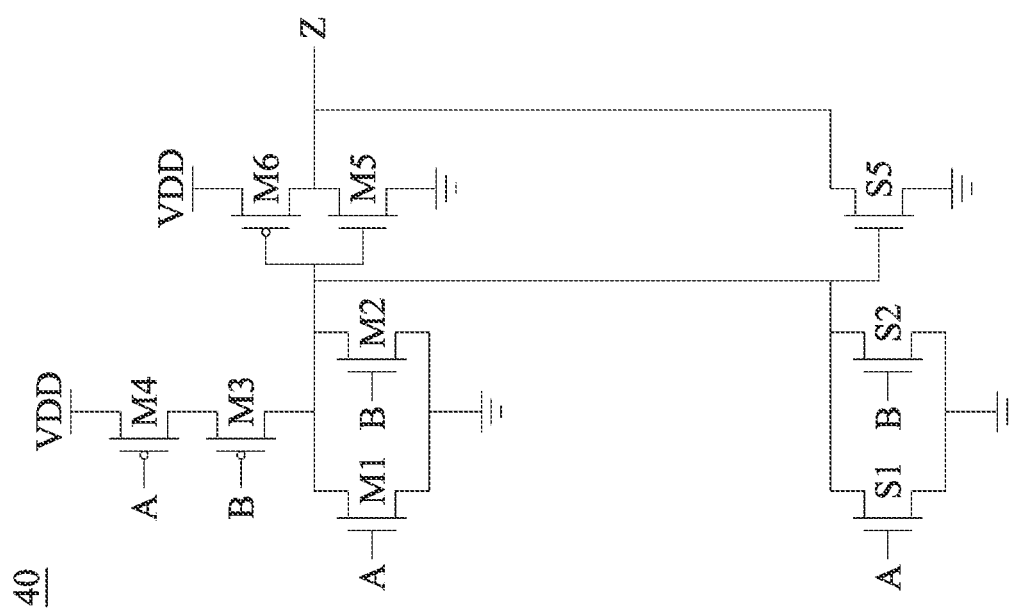
FIG. 4A is an equivalent circuit of part of an integrated circuit including structures corresponding to the semiconductor device in FIG. 1A, in accordance with some embodiments.

Reference is now made to FIGS. 4A-4B. FIG. 4A is an equivalent circuit of part of an integrated circuit 40 including structures corresponding to the semiconductor device in FIG. 1A, in accordance with some embodiments. FIG. 4B is a direct acyclic diagram corresponding to the equivalent circuit of part of the integrated circuit 40 in FIG. 4A, in accordance with some embodiments. With respect to the embodiments of FIGS. 1A-3D, like elements in FIGS. 4A-4B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIGS. 4A-4B.

Compared with FIGS. 3A-3B, instead of having both P and N type transistors, for example, the transistors S1-S6, as redundant transistors, the integrated circuit 40 merely includes N type transistors as redundant transistors, such like the transistors S1-S2 and S5.

Figure 4C:
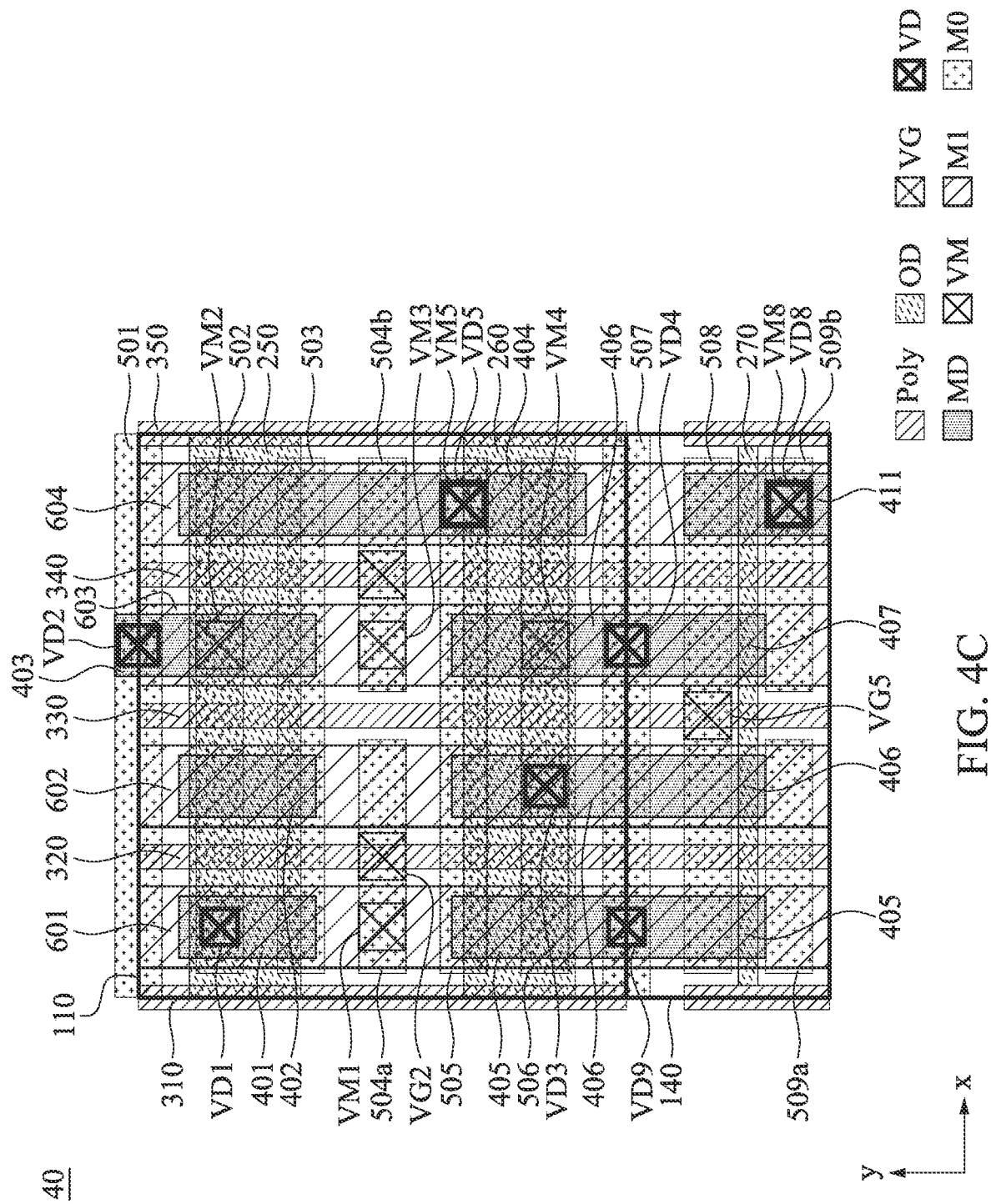
FIG. 4C is a layout diagram in a plan view of part of the integrated circuit corresponding to part of FIG. 4A, in accordance with some embodiments.

Reference is now made to FIG. 4C. FIG. 4C is a layout diagram in a plan view of part of the integrated circuit 40 corresponding to part of FIG. 4A, in accordance with some embodiments. With respect to the embodiments of FIGS. 1A-4B, like elements in FIG. 4C are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 4C.

Compared with FIG. 3D, instead of the layout structure of the cell CELL2 of FIG. 1A, the integrated circuit 40 includes the layout structure of the cell CELL3 of FIG. 1A. Alternatively stated, instead of having the sub-cell 130 including the P type transistors S3-S4 and S6, the integrated circuit 40 merely includes the sub-cell 140 having structures corresponding to N type transistors S1-S2 and S5.

Figure 5B:
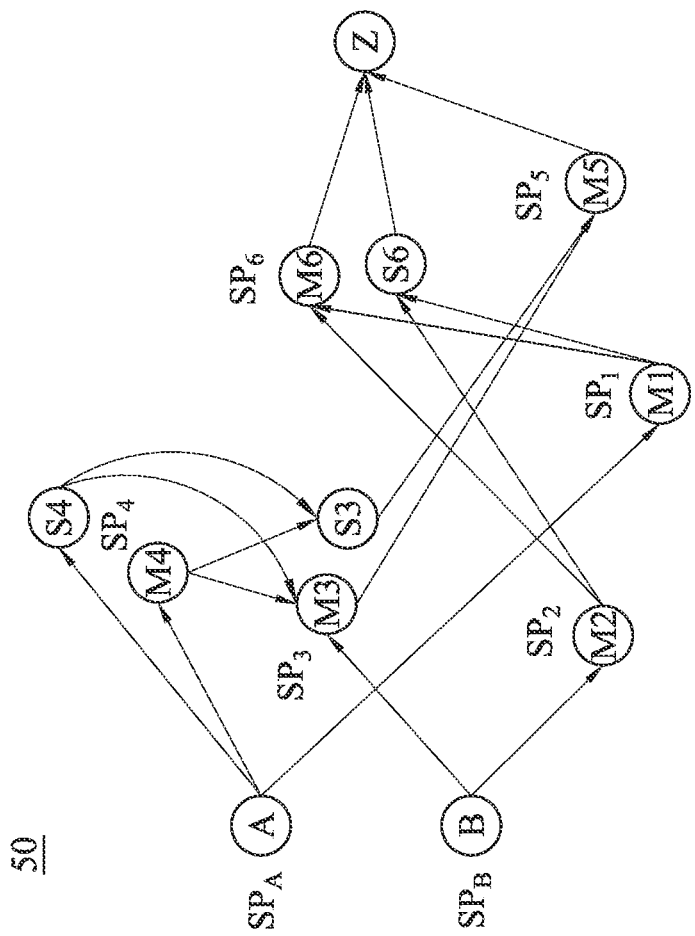
FIG. 5B is a direct acyclic diagram corresponding to the equivalent circuit of part of the integrated circuit in FIG. 5A, in accordance with some embodiments.
Figure 5A:
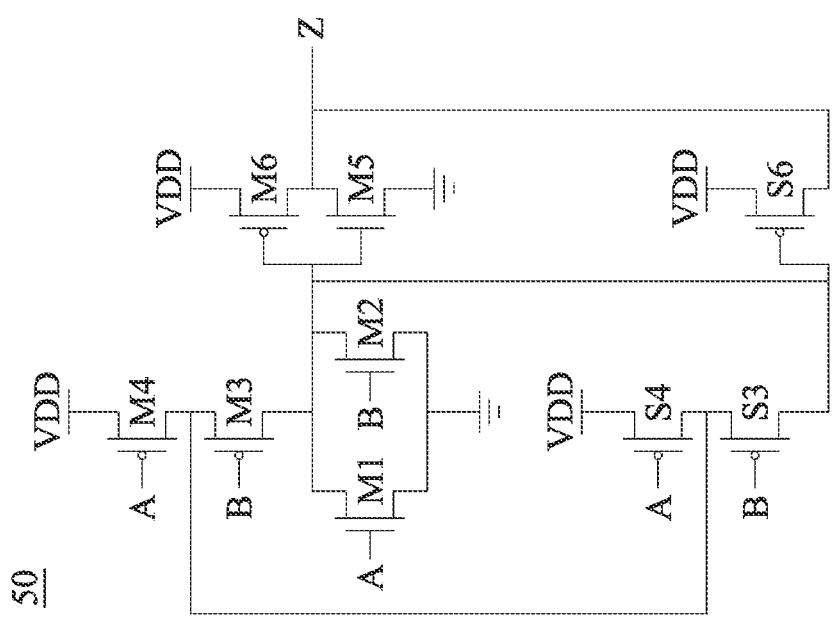
FIG. 5A is an equivalent circuit of part of an integrated circuit including structures corresponding to the semiconductor device in FIG. 1A, in accordance with some embodiments.

Reference is now made to FIGS. 5A-5B. FIG. 5A is an equivalent circuit of part of an integrated circuit 50 including structures corresponding to the semiconductor device in FIG. 1A, in accordance with some embodiments. FIG. 5B is a direct acyclic diagram corresponding to the equivalent circuit of part of the integrated circuit 50 in FIG. 5A, in accordance with some embodiments. With respect to the embodiments of FIGS. 1A-4C, like elements in FIGS. 5A-5B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIGS. 5A-5B.

Compared with FIGS. 3A-3B, instead of having both P and N type transistors, for example, the transistors S1-S6, as redundant transistors, the integrated circuit 50 merely includes P type transistors as redundant transistors, such like the transistors S3-S4 and S6.

Figure 5C:
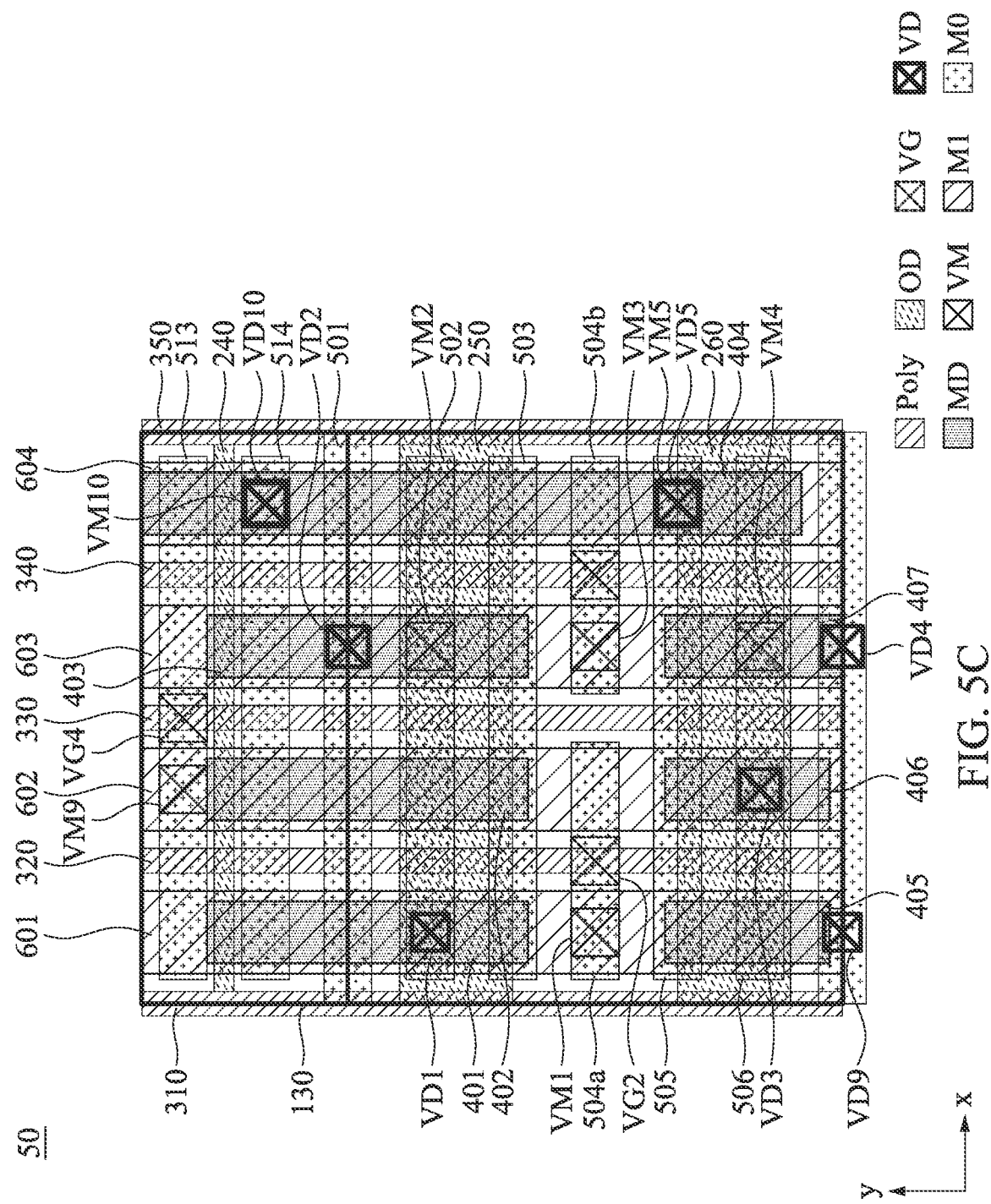
FIG. 5C is a layout diagram in a plan view of part of the integrated circuit corresponding to part of FIG. 5A, in accordance with some embodiments.

Reference is now made to FIG. 5C. FIG. 5C is a layout diagram in a plan view of part of the integrated circuit 50 corresponding to part of FIG. 5A, in accordance with some embodiments. With respect to the embodiments of FIGS. 1A-5B, like elements in FIG. 5C are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 5C.

Compared with FIG. 3D, instead of the layout structure of the cell CELL2 of FIG. 1A, the integrated circuit 50 includes the layout structure of the cell CELL4 of FIG. 1A. Alternatively stated, instead of having the sub-cell 140 including the N type transistors S1-S2 and S5, the integrated circuit 50 merely includes the sub-cell 130 having structures corresponding to P type transistors S3-S4 and S6.

Figure 6B:
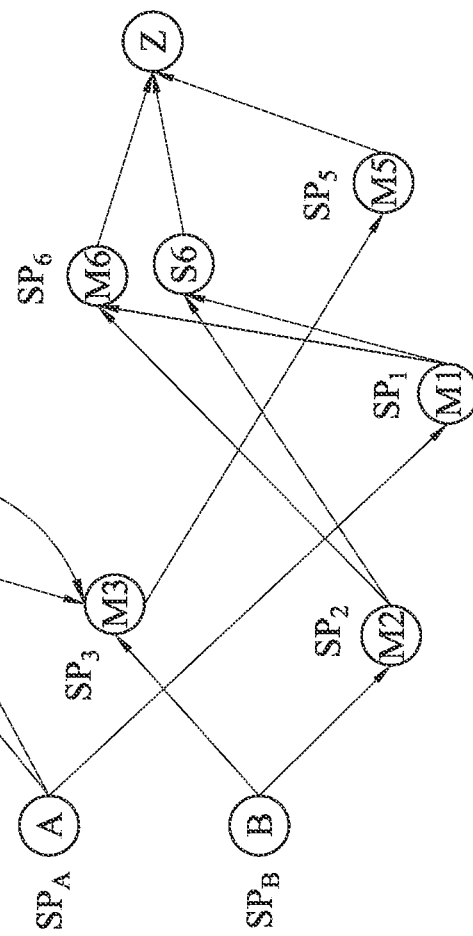
FIG. 6B is a direct acyclic diagram corresponding to the equivalent circuit of part of the integrated circuit in FIG. 6A, in accordance with some embodiments.
Figure 6A:
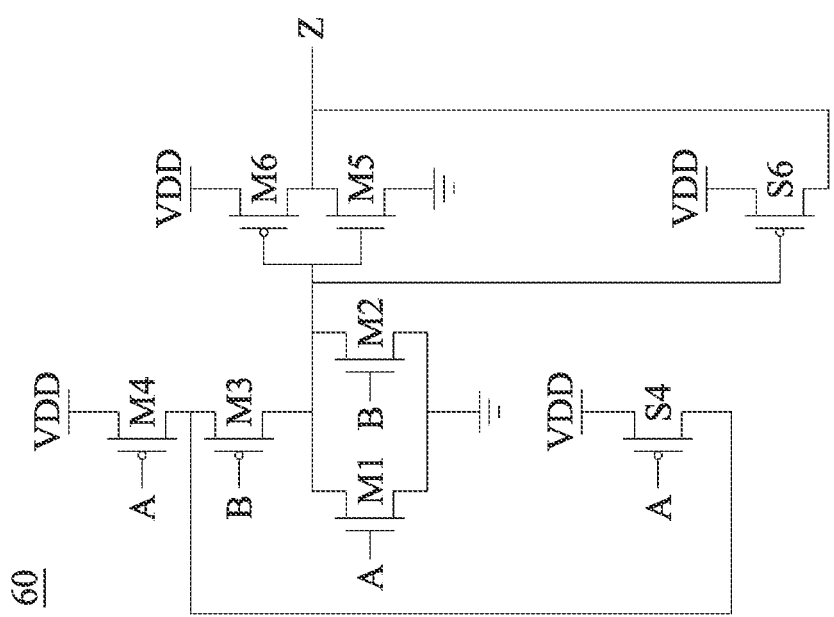
FIG. 6A is an equivalent circuit of part of an integrated circuit including structures corresponding to the semiconductor device in FIG. 1A, in accordance with some embodiments.

Reference is now made to FIGS. 6A-6B. FIG. 6A is an equivalent circuit of part of an integrated circuit 60 including structures corresponding to the semiconductor device in FIG. 1A, in accordance with some embodiments. FIG. 6B is a direct acyclic diagram corresponding to the equivalent circuit of part of the integrated circuit 60 in FIG. 6A, in accordance with some embodiments. With respect to the embodiments of FIGS. 1A-5C, like elements in FIGS. 6A-6B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIGS. 6A-6B.

Compared with FIGS. 5A-5B, instead of having all P type transistors S3-S4 and S6 that correspond to all P type transistors M3-M4 and M6 of the main logic circuit, the integrated circuit 60 merely includes portions of P type transistors, corresponding to P type transistors of the main logic circuit, as redundant transistors, such like the transistors S4 and S6.

Figure 6C:
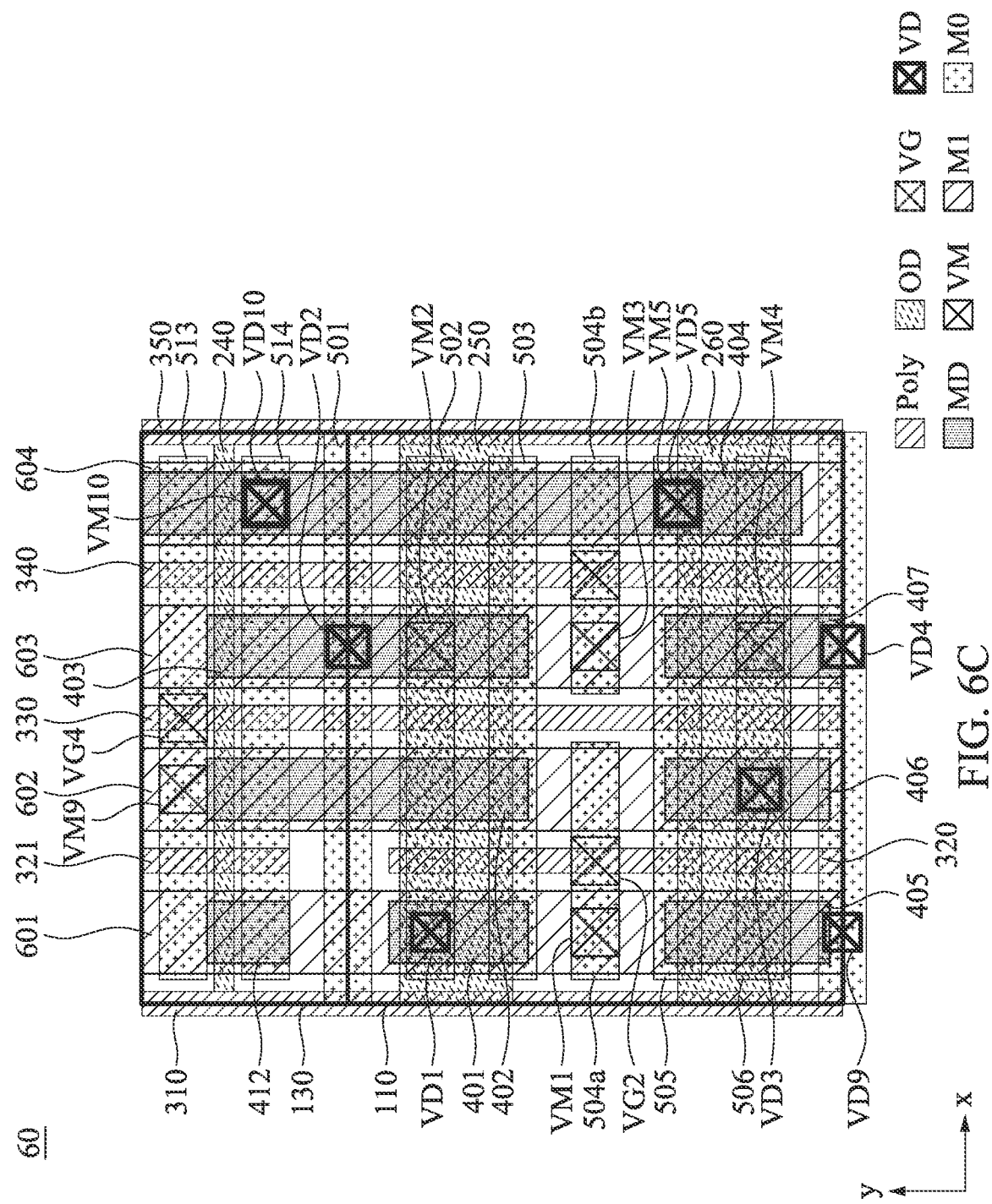
FIG. 6C is a layout diagram in a plan view of part of the integrated circuit corresponding to part of FIG. 6A, in accordance with some embodiments.

Reference is now made to FIG. 6C. FIG. 6C is a layout diagram in a plan view of part of the integrated circuit 60 corresponding to part of FIG. 6A, in accordance with some embodiments. With respect to the embodiments of FIGS. 1A-6B, like elements in FIG. 6C are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 6C.

Compared with FIG. 5C, the layout structures corresponding to the transistor S3 are adjusted. Specifically, the gate 320 does not extend through the sub-cell 110 to the sub-cell 130. Instead, the integrated circuit 60 includes a gate 321 crossing the active area 240, and the gate 321 is electrically isolated from the gate 320. In addition, the conductive pattern 401 does not extend through the sub-cell 110 to the sub-cell 130 as well. Instead, the integrated circuit 60 includes a conductive pattern 412 crossing the active area 240, and the conductive pattern 412 is electrically isolated from the conductive pattern 401.

Figure 7B:
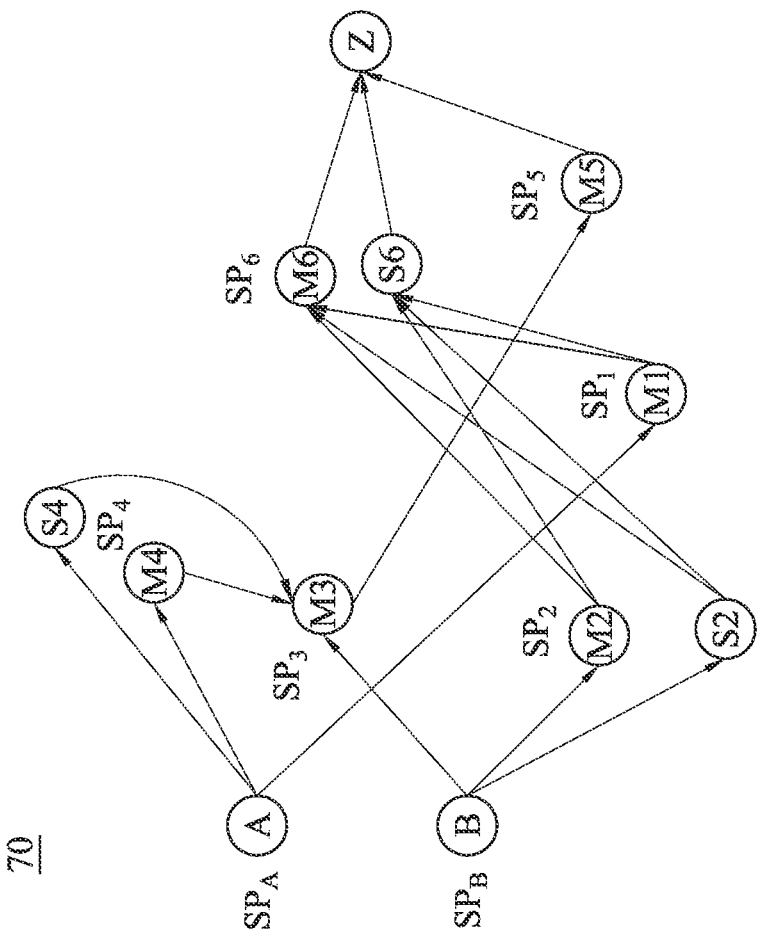
FIG. 7B is a direct acyclic diagram corresponding to the equivalent circuit of part of the integrated circuit in FIG. 7A, in accordance with some embodiments.
Figure 7A:
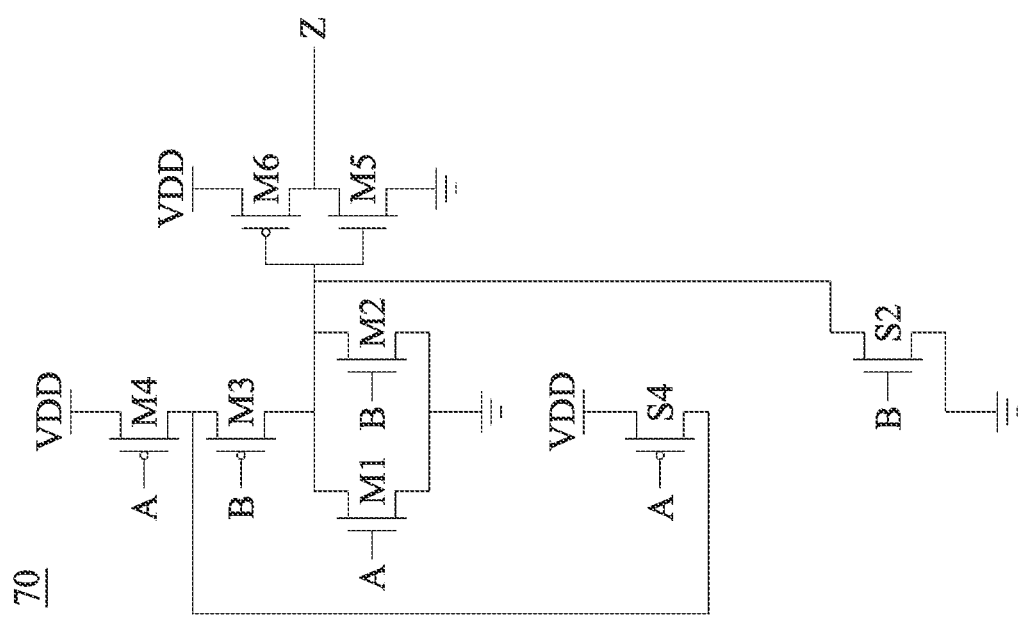
FIG. 7A is an equivalent circuit of part of an integrated circuit including structures corresponding to the semiconductor device in FIG. 1A, in accordance with some embodiments.

Reference is now made to FIGS. 7A-7B. FIG. 7A is an equivalent circuit of part of an integrated circuit 70 including structures corresponding to the semiconductor device in FIG. 1A, in accordance with some embodiments. FIG. 7B is a direct acyclic diagram corresponding to the equivalent circuit of part of the integrated circuit 70 in FIG. 7A, in accordance with some embodiments. With respect to the embodiments of FIGS. 1A-6C, like elements in FIGS. 7A-7B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIGS. 7A-7B.

Compared with FIGS. 6A-6B, instead of having only one type of transistor S4 and S6, the integrated circuit 70 includes N and P type transistors as redundant transistors, such like the transistors S2 and S4.

Furthermore, alternatively stated, compared with FIGS. 3A-3B, instead of having all N and P type transistors S1-S6, the integrated circuit 70 includes a portion of P type transistors, corresponding to P type transistors of the main logic circuit such like the transistor S4, and a portion of N type transistors, corresponding to N type transistors of the main logic circuit such like the transistor S2.

Figure 7C:
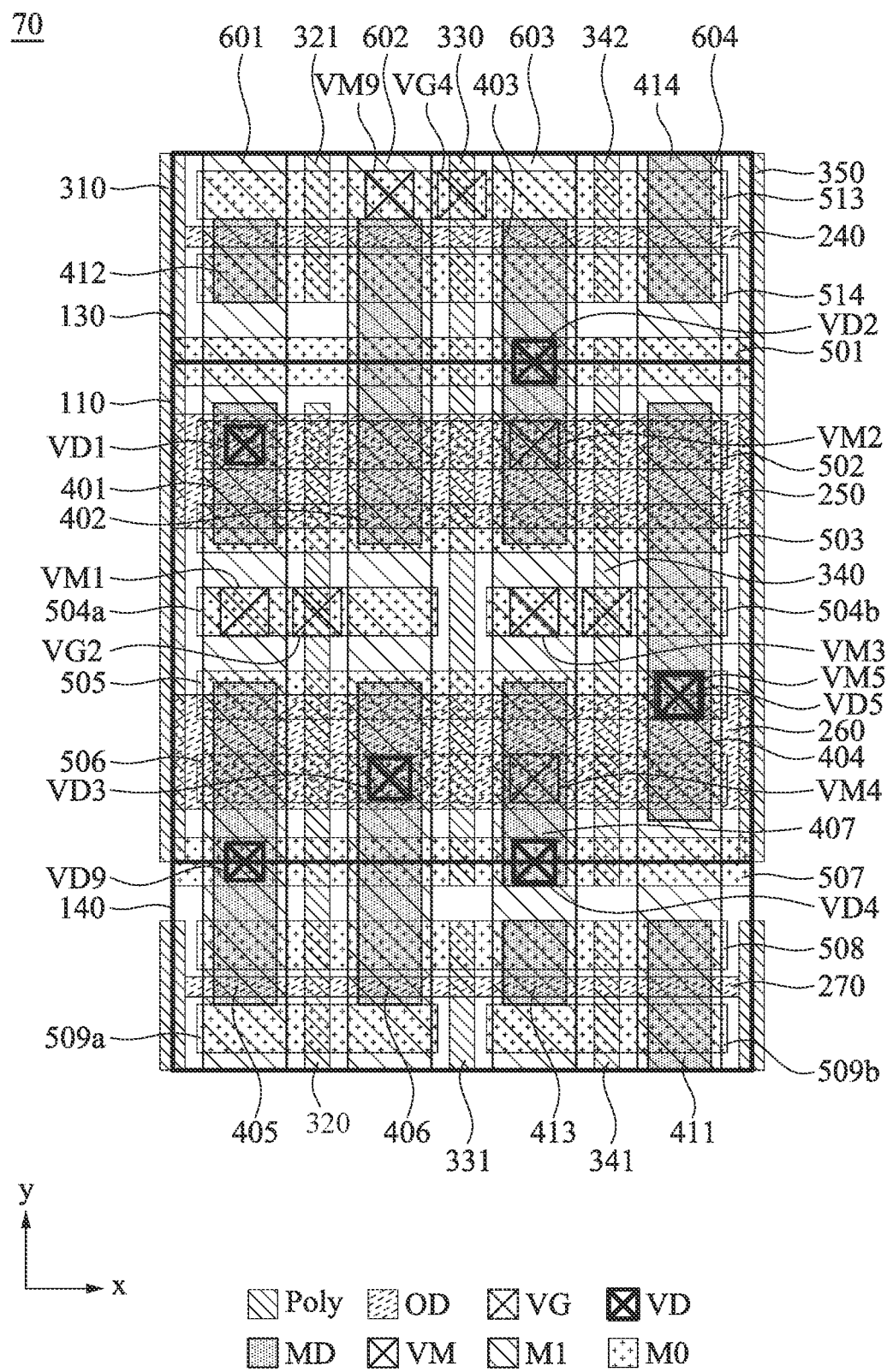
FIG. 7C is a layout diagram in a plan view of part of the integrated circuit corresponding to part of FIG. 7A, in accordance with some embodiments.

Reference is now made to FIG. 7C. FIG. 7C is a layout diagram in a plan view of part of the integrated circuit 70 corresponding to part of FIG. 7A, in accordance with some embodiments. With respect to the embodiments of FIGS. 1A-7B, like elements in FIG. 7C are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 7C.

Compared with FIG. 3D, the layout structures corresponding to the transistors S1, S3, and S5-S6 are adjusted. Specifically, the gate 320 does not cross the active area 240. Instead, the integrated circuit 70 includes the gate 321 crossing the active area 240, and the gate 321 is electrically isolated from the gate 320. The gate 330 does not cross the active area 270. Instead, the integrated circuit 70 includes a gate 331 crossing the active area 270, and the gate 331 is electrically isolated from the gate 330. The gate 340 does not cross the active areas 240 and 270. Instead, the integrated circuit 70 includes a gate 341 crossing the active areas 270 and a gate 342 crossing the active area 240. The gates 341-342 are electrically isolated from the gate 340.

The conductive pattern 404 does not extend into the sub-cell 130. Instead, the integrated circuit 70 further includes a conductive pattern 414 crossing the active area 240, and the conductive pattern 414 is electrically isolated from the conductive pattern 404. The conductive pattern 407 does not extend into the sub-cell 140. Instead, the integrated circuit 70 further includes a conductive pattern 413 crossing the active area 270, and the conductive pattern 413 is electrically isolated from the conductive pattern 407.

In addition, for illustration, the vias VD8 and VM8, configured to couple the conductive pattern 411 to the conductive pattern 404, are excluded in the embodiments of FIG. 7C.

Figure 8B:
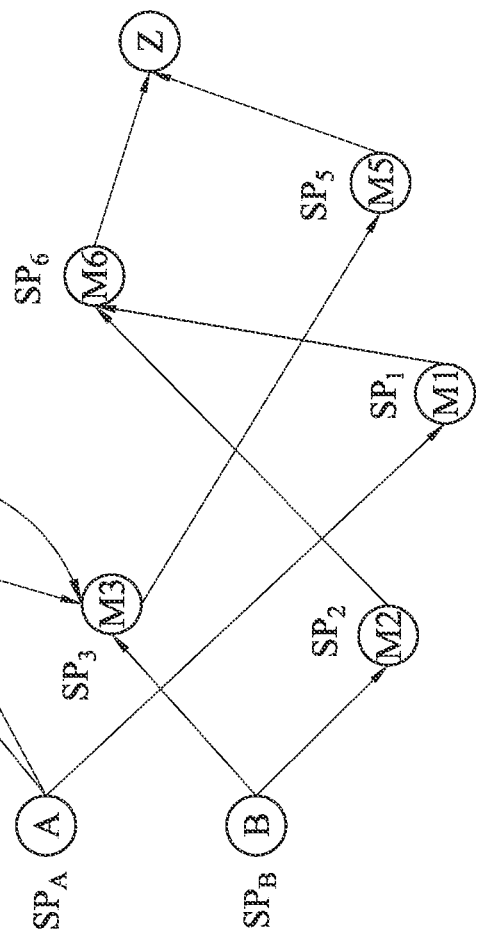
FIG. 8B is a direct acyclic diagram corresponding to the equivalent circuit of part of the integrated circuit in FIG. 8A, in accordance with some embodiments.
Figure 8A:
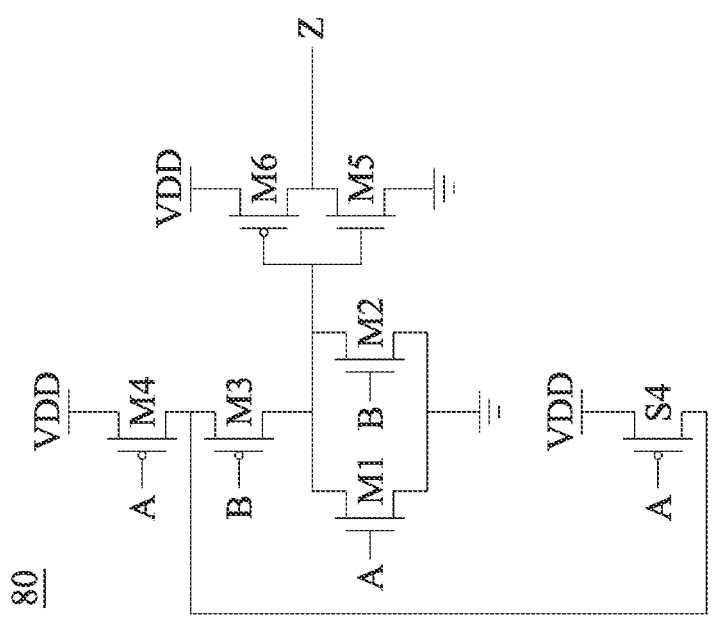
FIG. 8A is an equivalent circuit of part of an integrated circuit including structures corresponding to the semiconductor device in FIG. 1A, in accordance with some embodiments.

Reference is now made to FIGS. 8A-8B. FIG. 8A is an equivalent circuit of part of an integrated circuit 80 including structures corresponding to the semiconductor device in FIG. 1A, in accordance with some embodiments. FIG. 8B is a direct acyclic diagram corresponding to the equivalent circuit of part of the integrated circuit 80 in FIG. 8A, in accordance with some embodiments. With respect to the embodiments of FIGS. 1A-7C, like elements in FIGS. 8A-8B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIGS. 8A-8B.

Compared with FIGS. 7A-7B, the integrated circuit 80 includes only one P type transistor as redundant transistors, such like the transistor S4.

Figure 8C:
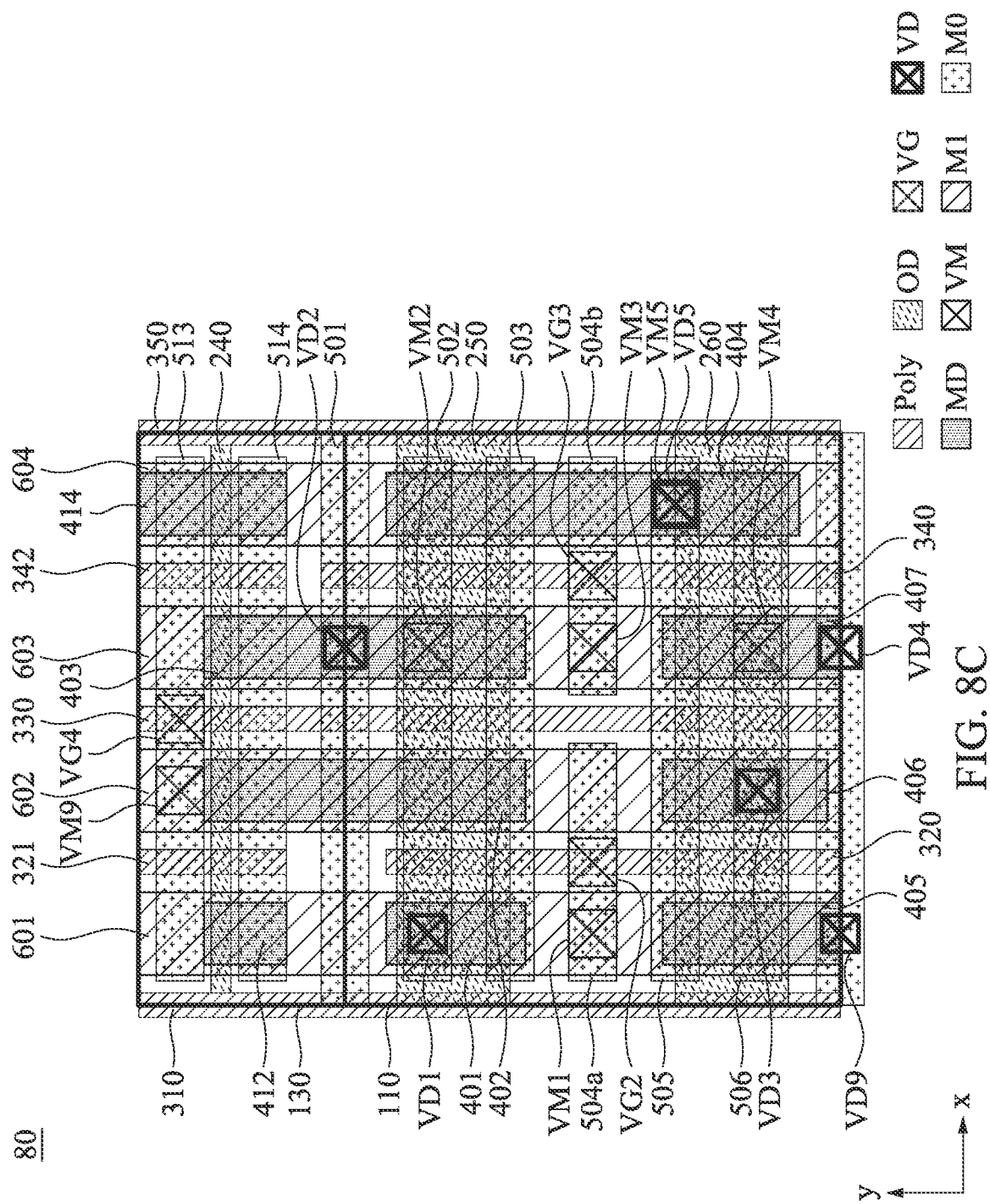
FIG. 8C is a layout diagram in a plan view of part of the integrated circuit corresponding to part of FIG. 8A, in accordance with some embodiments.

Reference is now made to FIG. 8C. FIG. 8C is a layout diagram in a plan view of part of the integrated circuit 80 corresponding to part of FIG. 8A, in accordance with some embodiments. With respect to the embodiments of FIGS. 1A-8B, like elements in FIG. 8C are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 8C.

Compared with FIG. 7C, the integrated circuit 80 includes sub-cell 130 without including the sub-cell 140.

The configurations of FIGS. 3A-8C are given for illustrative purposes. Various implements of FIGS. 3A-8C are within the contemplated scope of the present disclosure. For example, in some embodiments, instead of having only one P type transistor as the redundant transistor, an integrated circuit includes only one N type transistors as the redundant transistor, such as, the transistor S2 corresponding the transistor M2.

Figure 9:
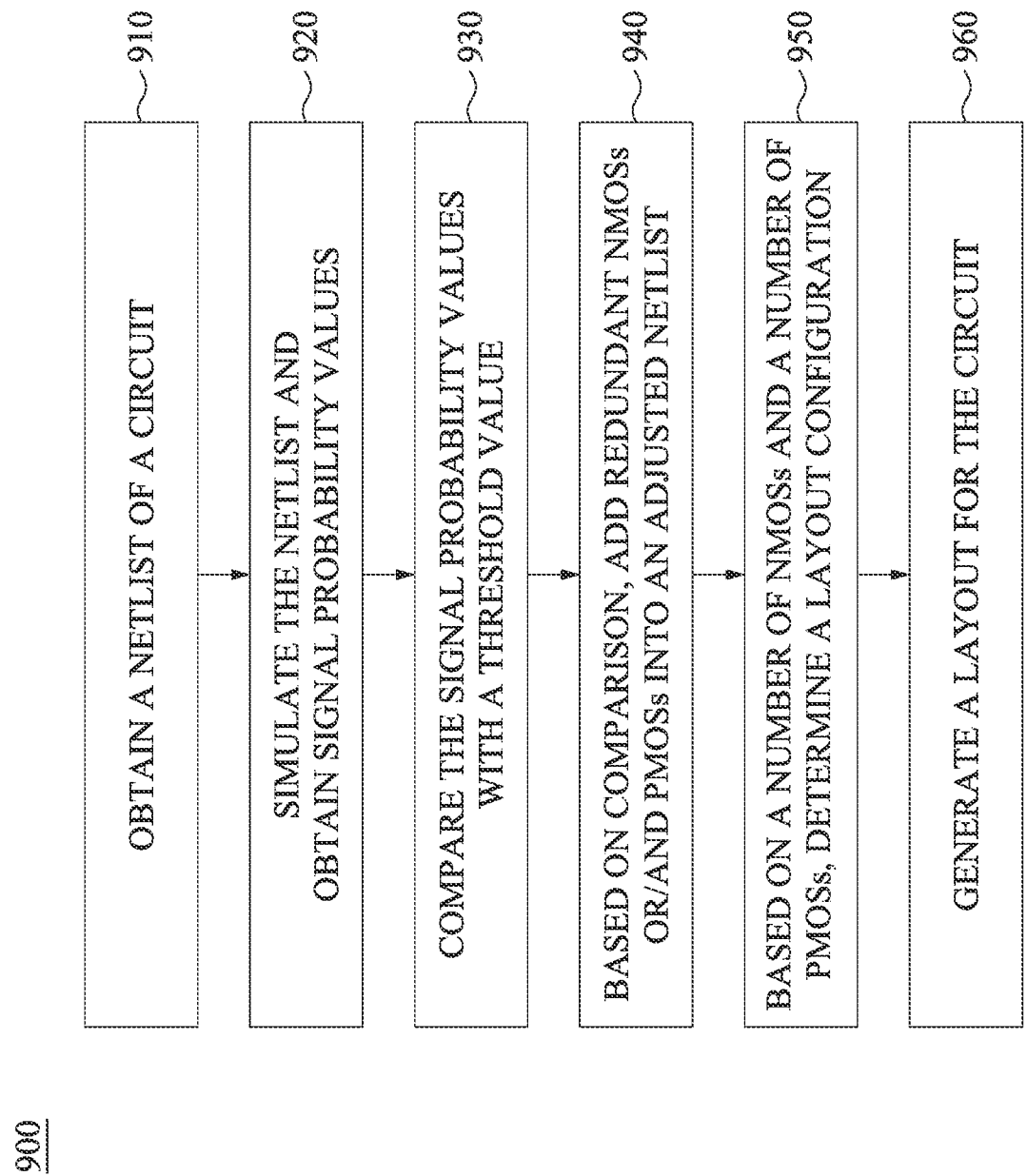
FIG. 9 is a flow chart of a method of generating a layout design for designing the layout of the integrated circuit and fabricating the integrated circuit, in accordance with some embodiments of the present disclosure.

Reference is now made to FIG. 9. FIG. 9 is a flow chart of the method 900 of generating a layout design for designing the layout of the integrated circuit and fabricating the integrated circuit, in accordance with some embodiments of the present disclosure. It is understood that additional operations can be provided before, during, and after the processes shown by FIG. 9, and some of the operations described below can be replaced or eliminated, for additional embodiments of the method. The order of the operations/processes may be interchangeable. Throughout the various views and illustrative embodiments, like reference numbers are used to designate like elements. The method 900 includes operations 910-960 that are described below with reference to the integrated circuit 10 of FIGS. 1A-1B and the integrated circuits 30-80 of FIGS. 3A-8C.

In operation 910, a netlist of the integrated circuit 30 is obtained.

In operation 920, the netlist of the integrated circuit 30 is simulated with some operation parameter of the integrated circuit 30, and based on the result of the simulation, the values $SP_1$-$SP_6$ in which each corresponds to one of the transistors M1-M6 included in the integrated circuit 30 are obtained. In some embodiments, the integrated circuit 30 includes more than six transistors or less than six transistors.

In operation 930, each of the values $SP_1$-$SP_6$ is compared with a threshold value $C_{crit}$. In some embodiments, the threshold value $C_{crit}$ heavily depends on the process parameter, such like, a thickness of the gate oxide layer. Accordingly, the the threshold value $C_{crit}$ varies with the process and is defined corresponding to the actual applications.

In some embodiments, the values $SP_3$-$SP_4$ and $SP_6$ of P type transistors are compared with the threshold value $C_{crit}$, and the values $SP_1$-$SP_2$ and $SP_5$ of N type transistors are compared with a value $(1-C_{crit})$.

In operation 940, based on the comparison, when the value corresponding to P type transistor is smaller than the threshold value $C_{crit}$, a corresponding redundant p type transistor is added into the netlist of the integrated circuit 30 for generating an adjusted netlist. For example, in the embodiments of FIGS. 3A-3B, the values $SP_3$-$SP_4$ and $SP_6$ are all equal to 0.2 which is smaller than the threshold value $C_{crit}$ having a value of 0.3. Accordingly, the transistors S3-S4 and S6 are added into the netlist as shown in FIG. 3B. Similarly, the values $SP_1$-$SP_2$ and $SP_5$ are all equal to 0.2 which is smaller than the value of 0.7 (that is, 1 subtracts $C_{crit}$). Accordingly, the transistors S1-S2 and S5 are added into the netlist as shown in FIG. 3B.

In operation 950, based on a number of N type transistors and a number of P type transistors that are configured as redundant transistors, a layout configuration is determined for the circuit. Alternatively stated, the layout configuration with redundant transistors varies in accordance with the adjusted netlist. For example, in the embodiments of FIGS. 4A-4C, no P type transistor is added as a redundant transistor while three N type transistors are added. Accordingly, the layout configuration configured with respect to, for example, the cell CELL3 of FIG. 1A is assigned to the integrated circuit 40.

In the embodiments of FIGS. 5A-6C and 8A-8C, no N type transistor is added as a redundant transistor while one or more P type transistors are added. Accordingly, the layout configuration configured with respect to, for example, the cell CELL4 of FIG. 1A is assigned to the integrated circuits 50, 60, and 80.

In some embodiments, there is at least one of N transistor and at least one of P transistor that are added as redundant transistors. The method 900 further includes operation to determine, based on resistor-and-capacitor values of routing, one of the layout configurations for the circuits. For example, in some embodiments, the layout configuration as shown by the cell CELL1 of FIG. 1A is determined for the integrated circuit, such like, the integrated circuit 30 of FIG. 3C processed with small resistor-and-capacitor value for back-end-of-line (BEOL) and larger resistor-and-capacitor value for middle-end-of-line (MEOL), compared with BEOL. In alternative embodiments, the layout configuration as shown by the cell CELL2 of FIG. 1A is determined for the integrated circuit, such like, the integrated circuit 30' of FIG. 3D processed with large resistor-and-capacitor value for BEOL and smaller resistor-and-capacitor value for MEOL, compared with BEOL.

In some embodiments, the integrated circuit fabrication process is often considered to include a front-end-of-line (FEOL) portion, the middle-end-of-line (MEOL) portion, also called a Middle-Of-The-Line (MOL) portion, and the back-end-of-line (BEOL) portion. FEOL is the first portion of integrated circuit fabrication wherein individual active devices are patterned on a semiconductor wafer. FEOL processes include: selecting the type of semiconductor wafer to be used; chemical-mechanical planarization and cleaning of the wafer; shallow trench isolation (STI); well formation, gate module formation, and source and drain creation. FEOL does not include the deposition of metal interconnect layers. MEOL processes occur after FEOL processes and include gate contact formation and under bump metallization (UBM) processes. BEOL is the final portion of the integrated circuit fabrication process where the individual devices (transistors, capacitors, resistors, etc.) are interconnected with vias and conductive traces, e.g., metal lines. BEOL generally begins when the first layer of metal is deposited and includes contacts, insulating layers (dielectrics), metal levels, and bonding sites for chip-to-package connections. In some embodiments, ten or more metal layers are added in the BEOL portion.

In some embodiments, the method 900 includes assigning one of the layout configurations referred to the cells CELL5-CELL8 to an integrated circuit in order to add more redundant transistors of one or more particular conductivity types. The operation of assigning mentioned above, in some embodiments, is associated with the number of N type transistors and the number of P type transistors that are configured as redundant transistors.

In operation 960, the layout, such like, FIGS. 3C-3D, 4C, 5C, 6C, 7C and 8C, for the integrated circuit is generated.

Figure 10:
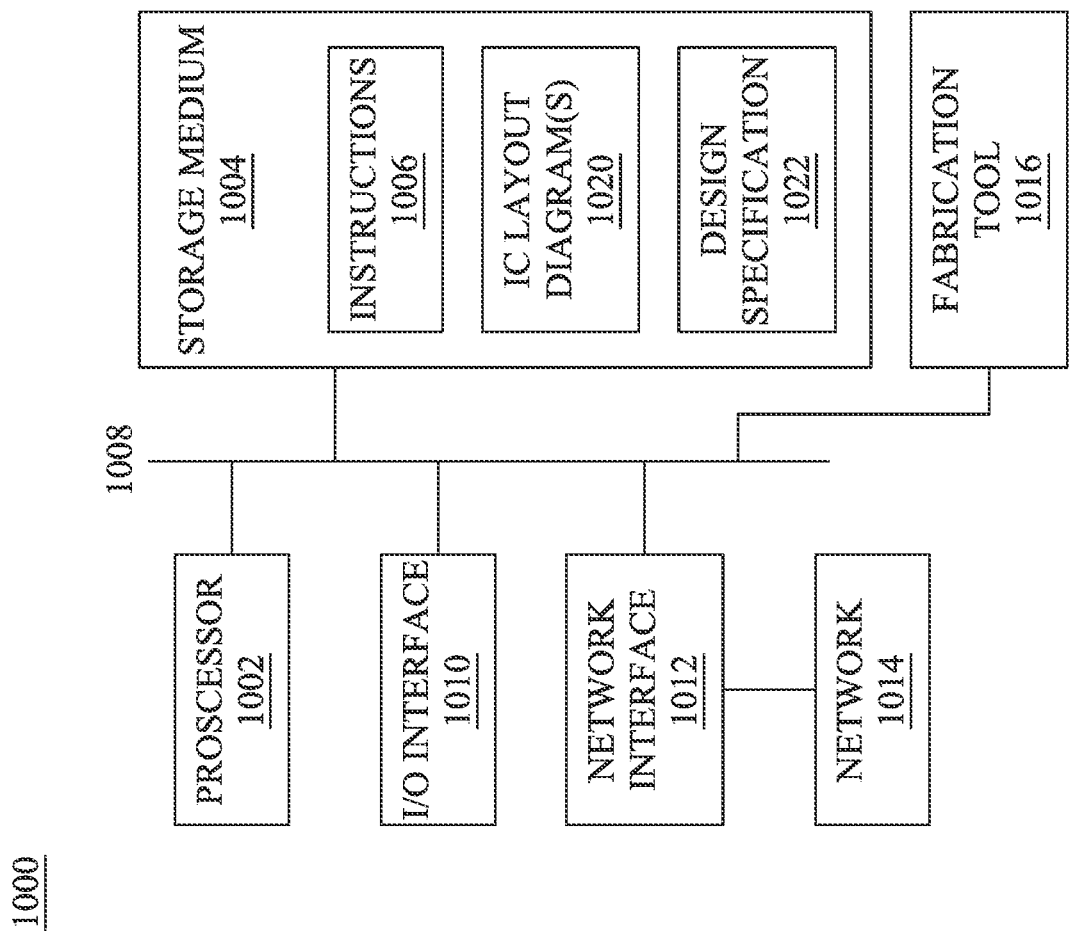
FIG. 10 is a block diagram of a system for designing the integrated circuit layout design, in accordance with some embodiments of the present disclosure.

Reference is now made to FIG. 10. FIG. 10 is a block diagram of electronic design automation (EDA) system 1000 for designing the integrated circuit layout design, in accordance with some embodiments of the present disclosure. EDA system 1000 is configured to implement one or more operations of the method 900 disclosed in FIG. 9, and further explained in conjunction with FIGS. 1A-8C. In some embodiments, EDA system 1000 includes an APR system.

In some embodiments, EDA system 1000 is a general purpose computing device including a hardware processor 1002 and a non-transitory, computer-readable storage medium 1004. Storage medium 1004, amongst other things, is encoded with, i.e., stores, computer program code (instructions) 1006, i.e., a set of executable instructions. Execution of instructions 1006 by hardware processor 1002 represents (at least in part) an EDA tool which implements a portion or all of, e.g., the method 900.

The processor 1002 is electrically coupled to computer-readable storage medium 1004 via a bus 1008. The processor 1002 is also electrically coupled to an I/O interface 1010 and a fabrication tool 1016 by bus 1008. A network interface 1012 is also electrically connected to processor 1002 via bus 1008. Network interface 1012 is connected to a network 1014, so that processor 1002 and computer-readable storage medium 1004 are capable of connecting to external elements via network 1014. The processor 1002 is configured to execute computer program code 1006 encoded in computer-readable storage medium 1004 in order to cause EDA system 1000 to be usable for performing a portion or all of the noted processes and/or methods. In one or more embodiments, processor 1002 is a central processing unit (CPU), a multi-processor, a distributed processing system, an application specific integrated circuit (ASIC), and/or a suitable processing unit.

In one or more embodiments, computer-readable storage medium 1004 is an electronic, magnetic, optical, electromagnetic, infrared, and/or a semiconductor system (or apparatus or device). For example, computer-readable storage medium 1004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1004 includes a compact disk-read only memory (CD-ROM), a compact disk-read/write (CD-R/W), and/or a digital video disc (DVD).

In one or more embodiments, storage medium 1004 stores computer program code 1006 configured to cause EDA system 1000 (where such execution represents (at least in part) the EDA tool) to be usable for performing a portion or all of the noted processes and/or methods. In one or more embodiments, storage medium 1004 also stores information which facilitates performing a portion or all of the noted processes and/or methods. In one or more embodiments, storage medium 1004 stores IC layout diagram 1020 of standard cells including such standard cells as disclosed herein, for example, a cell including the integrated circuits and the semiconductor device discussed above with respect to FIGS. 1A-11.

EDA system 1000 includes I/O interface 1010. I/O interface 1010 is coupled to external circuitry. In one or more embodiments, I/O interface 1010 includes a keyboard, keypad, mouse, trackball, trackpad, touchscreen, and/or cursor direction keys for communicating information and commands to processor 1002.

EDA system 1000 also includes network interface 1012 coupled to processor 1002. Network interface 1012 allows EDA system 1000 to communicate with network 1014, to which one or more other computer systems are connected. Network interface 1012 includes wireless network interfaces such as BLUETOOTH, WIFI, WIMAX, GPRS, or WCDMA; or wired network interfaces such as ETHERNET, USB, or IEEE-1064. In one or more embodiments, a portion or all of noted processes and/or methods are implemented in two or more systems 1000.

EDA system 1000 also includes the fabrication tool 1016 coupled to processor 1002. The fabrication tool 1016 is configured to fabricate integrated circuits, e.g., the integrated circuits 10, 30, 30', 40-80 illustrated in FIGS. 1A-8C, according to the design files processed by the processor 1002.

EDA system 1000 is configured to receive information through I/O interface 1010. The information received through I/O interface 1010 includes one or more of instructions, data, design rules, libraries of standard cells, and/or other parameters for processing by processor 1002. The information is transferred to processor 1002 via bus 1008. EDA system 1000 is configured to receive information related to a UI through I/O interface 1010. The information is stored in computer-readable medium 1004 as design specification 1022.

In some embodiments, a portion or all of the noted processes and/or methods are implemented as a standalone software application for execution by a processor. In some embodiments, a portion or all of the noted processes and/or methods are implemented as a software application that is a part of an additional software application. In some embodiments, a portion or all of the noted processes and/or methods are implemented as a plug-in to a software application. In some embodiments, at least one of the noted processes and/or methods are implemented as a software application that is a portion of an EDA tool. In some embodiments, a portion or all of the noted processes and/or methods are implemented as a software application that is used by EDA system 1000. In some embodiments, a layout diagram which includes standard cells is generated using a suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 11:
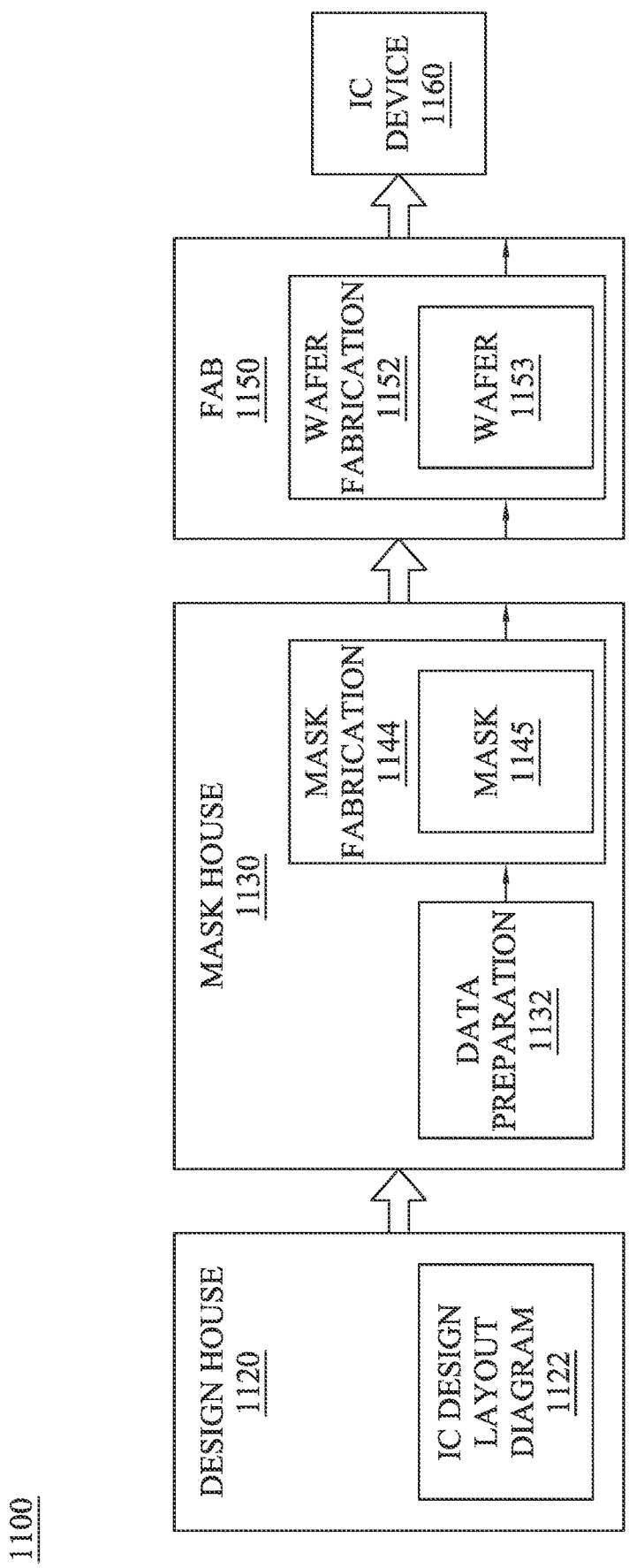
FIG. 11 is a block diagram of an integrated circuit manufacturing system, and an integrated circuit manufacturing flow associated therewith, in accordance with some embodiments.

FIG. 11 is a block diagram of IC manufacturing system 1100, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1100.

In FIG. 11, IC manufacturing system 1100 includes entities, such as a design house 1120, a mask house 1130, and an IC manufacturer/fabricator ("fab") 1150, that interact with one another in the design, development, and manufacturing cycles and/or services related to manufacturing an IC device 1160. The entities in IC manufacturing system 1100 are connected by a communications network. In some embodiments, the communications network is a single network. In some embodiments, the communications network is a variety of different networks, such as an intranet and the Internet. The communications network includes wired and/ or wireless communication channels. Each entity interacts with one or more of the other entities and provides services to and/or receives services from one or more of the other entities. In some embodiments, two or more of design house 1120, mask house 1130, and IC fab 1150 is owned by a single entity. In some embodiments, two or more of design house 1120, mask house 1130, and IC fab 1150 coexist in a common facility and use common resources.

Design house (or design team) 1120 generates an IC design layout diagram 1122. IC design layout diagram 1122 includes various geometrical patterns, for example, an IC layout design depicted in FIGS. 3A, 4A, 5A, 6A, 7A, and/or 8A, designed for an IC device 1160, for example, the integrated circuits 10, 30, 30', 40-80 illustrated in FIGS. 1A-8C. The geometrical patterns correspond to patterns of metal, oxide, or semiconductor layers that make up the various components of IC device 1160 to be fabricated. The various layers combine to form various IC features. For example, a portion of IC design layout diagram 1122 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1120 implements a proper design procedure to form IC design layout diagram 1122. The design procedure includes one or more of logic design, physical design or place and route. IC design layout diagram 1122 is presented in one or more data files having information of the geometrical patterns. For example, IC design layout diagram 1122 can be expressed in a GDSII file format or DFII file format.

Mask house 1130 includes data preparation 1132 and mask fabrication 1144. Mask house 1130 uses IC design layout diagram 1122 to manufacture one or more masks 1145 to be used for fabricating the various layers of IC device 1160 according to IC design layout diagram 1122. Mask house 1130 performs mask data preparation 1132, where IC design layout diagram 1122 is translated into a representative data file ("RDF"). Mask data preparation 1132 provides the RDF to mask fabrication 1144. Mask fabrication 1144 includes a mask writer. A mask writer converts the RDF to an image on a substrate, such as a mask (reticle) 1145 or a semiconductor wafer 1153. The IC design layout diagram 1122 is manipulated by mask data preparation 1132 to comply with particular characteristics of the mask writer and/or requirements of IC fab 1150. In FIG. 11, data preparation 1132 and mask fabrication 1144 are illustrated as separate elements. In some embodiments, data preparation 1132 and mask fabrication 1144 can be collectively referred to as mask data preparation.

In some embodiments, data preparation 1132 includes optical proximity correction (OPC) which uses lithography enhancement techniques to compensate for image errors, such as those that can arise from diffraction, interference, other process effects and the like. OPC adjusts IC design layout diagram 1122. In some embodiments, data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1132 includes a mask rule checker (MRC) that checks the IC design layout diagram 1122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1122 to compensate for limitations during mask fabrication 1144, which may undo part of the modifications performed by OPC in order to meet mask creation rules.

In some embodiments, data preparation 1132 includes lithography process checking (LPC) that simulates processing that will be implemented by IC fab 1150 to fabricate IC device 1160. LPC simulates this processing based on IC design layout diagram 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1122.

It should be understood that the above description of data preparation 1132 has been simplified for the purposes of clarity. In some embodiments, data preparation 1132 includes additional features such as a logic operation (LOP) to modify the IC design layout diagram 1122 according to manufacturing rules. Additionally, the processes applied to IC design layout diagram 1122 during data preparation 1132 may be executed in a variety of different orders.

After data preparation 1132 and during mask fabrication 1144, a mask 1145 or a group of masks 1145 are fabricated based on the modified IC design layout diagram 1122. In some embodiments, mask fabrication 1144 includes performing one or more lithographic exposures based on IC design layout diagram 1122. In some embodiments, an electron-beam (e-beam) or a mechanism of multiple e-beams is used to form a pattern on a mask (photomask or reticle) 1145 based on the modified IC design layout diagram 1122. Mask 1145 can be formed in various technologies. In some embodiments, mask 1145 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1145 includes a transparent substrate (for example, fused quartz) and an opaque material (for example, chromium) coated in the opaque regions of the binary mask. In another example, mask 1145 is formed using a phase shift technology. In a phase shift mask (PSM) version of mask 1145, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1144 is used in a variety of processes. For example, such a mask(s) is used in an ion implantation process to form various doped regions in semiconductor wafer 1153, in an etching process to form various etching regions in semiconductor wafer 1153, and/or in other suitable processes.

IC fab 1150 includes wafer fabrication 1152. IC fab 1150 is an IC fabrication business that includes one or more manufacturing facilities for the fabrication of a variety of different IC products. In some embodiments, IC Fab 1150 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1150 uses mask(s) 1145 fabricated by mask house 1130 to fabricate IC device 1160. Thus, IC fab 1150 at least indirectly uses IC design layout diagram 1122 to fabricate IC device 1160. In some embodiments, semiconductor wafer 1153 is fabricated by IC fab 1150 using mask(s) 1145 to form IC device 1160. In some embodiments, the IC fabrication includes performing one or more lithographic exposures based at least indirectly on IC design layout diagram 1122. Semiconductor wafer 1153 includes a silicon substrate or other proper substrate having material layers formed thereon. Semiconductor wafer 1153 further includes one or more of various doped regions, dielectric features, multi-level interconnects, and the like (formed at subsequent manufacturing steps).

As described above, integrated circuits and the methodology in the present disclosure utilize the excellence of hybrid row architecture in reducing shadowed cell area, timing and power overhead by half while extending cell TDDB lifetime.

In some embodiments, an integrated circuit is disclosed, including first transistors of a first circuit arranged in a first cell row having a first number of fin structures and a second transistor of a second circuit. The second transistor is coupled in parallel with a first element in the first transistors between first and second terminals of the first circuit, and arranged in a second cell row having a second number, different from the first number, of fin structures. The first element and the second transistor share a first gate extending in a first direction to pass through the first and second cell rows in a layout view. The second transistor is a duplication of the first element. In some embodiments, the integrated circuit further includes third and fourth transistors of the second circuit. The third and fourth transistors are arranged in the second cell row and coupled in parallel with second and third elements in the first transistors between an output terminal of the first circuit and a third terminal of the first circuit. In some embodiments, the third and fourth transistors are duplication of the second and third elements of the first transistors regarding functionality. In some embodiments, the integrated circuit further includes a third transistor of the second circuit. The third transistor is coupled in parallel with a second element in the first transistors between third and fourth terminals of the first circuit, and arranged in a third cell row having the second number of fin structures. The third transistor and the second element share a second gate extending in the first direction to pass through the first and third cell rows in the layout view. In some embodiments, the second and third transistors have different conductivity types. In some embodiments, a cell height of the first cell row is different from cell heights of the second and third cell rows. In some embodiments, a cell height of the first cell row is greater than a cell height of the second cell row. In some embodiments, the integrated circuit further includes a third transistor of the second circuit arranged in a third cell row and coupled between third and fourth terminals of the first circuit. The second and third transistors have different conductivity types. The second and third cell rows are arranged on opposite sides of the first cell row. In some embodiments, the third transistor and a second element of the first transistors are coupled in parallel between the third and fourth terminals of the first circuit and configured to receive a control signal at gates thereof.

Also disclosed is a device including a circuit that is configured to generate an output signal in response to a first and second control signals and includes a first cell receiving the first and second control signals and a second cell receiving the first control signal, the second control signal, or a combination thereof. The first and second cells have different cell heights and an asymmetrical configuration of fin structures with respect to a cell boundary, between the first and second cells, of the first cell. In some embodiments, the first cell is arranged in a first cell row having a first number of fin structures, and the second cell is arranged in a second cell row having a second number, different from the first number, of fin structures. In some embodiments, the first cell in the circuit includes first and second transistors of a first conductivity type coupled in series between a first voltage terminal and drains of third and fourth transistors of a second conductivity type. Sources of the third and fourth transistors are coupled to a second voltage terminal. The first cell further includes an inverter between an output terminal and the drains of the third and fourth transistors. The second cell includes fifth and sixth transistors of the first conductivity type, the fifth and sixth transistors coupled between the first voltage terminal and the drains of the third and fourth transistors. In some embodiments, gates of the first and fifth transistors receive the first control signal, and gates of the second and sixth transistors receive the second control signal. In some embodiments, a cell height of the first cell is greater than a cell height of the second cell.

Also disclosed is an integrated circuit, including first and second cells that abut each other at a first cell boundary of the first cell and have different cell heights. A placement of multiple first transistors in the first cell and a placement of multiple second transistors in the second cell are symmetric with respect to the first cell boundary of the first cell in a layout view. Each one of the second transistors and a corresponding one in the first transistors have the same operation configuration. In some embodiments, a placement of multiple third transistors in the first cell and a placement of multiple fourth transistors in the second cell are symmetric with respect to the first cell boundary of the first cell in the layout view. Each one of the fourth transistors and a corresponding one in the third transistors have the same operation configuration. In some embodiments, the integrated circuit further includes a first gate structure extending to pass the first cell boundary of the first cell and shared by a first element in the first transistors, a first element in the second transistors, a first element in the third transistors, and a first element in the fourth transistors. In some embodiments, the integrated circuit further includes a second gate structure extending to pass the first cell boundary of the first cell and shared by a second element in the first transistors, a second element in the second transistors, a second element in the third transistors, and a second element in the fourth transistors. In some embodiments, the integrated circuit further includes a third cell abutting the first cell at a second cell boundary of the first cell. A placement of multiple third transistors in the first cell and a placement of multiple fourth transistors in the third cell are symmetric with respect to the second cell boundary of the first cell in the layout view. Each one of the fourth transistors and a corresponding one in the third transistors have the same operation configuration. In some embodiments, the integrated circuit further includes a gate structure extending to pass the first and second cell boundaries of the first cell and shared by one in the first transistors, one in the second transistors, one in the third transistors, and one in the fourth transistors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a plurality of first transistors of a first circuit arranged in a first cell row having a first number of fin structures; and
a second transistor of a second circuit, wherein a first terminal of the second transistor of the second circuit is coupled to a first terminal of a first transistor in the plurality of first transistors, and a second terminal of the second transistor of the second circuit is coupled to a second terminal of the first transistor in the plurality of first transistors, wherein the second transistor of the second circuit is arranged in a second cell row having a second number, different from the first number, of fin structures,
wherein the first transistor in the plurality of first transistors and the second transistor of the second circuit have gate terminals coupled together to receive a first signal, and share a first gate extending in a first direction to pass through the first and second cell rows in a layout view,
wherein the second transistor of the second circuit and the first transistor in the plurality of first transistors are configured to generate, in response to the first signal, a second signal at the first terminals of the first transistor in the plurality of first transistors and the second transistor of the second circuit.

2. The integrated circuit of claim 1, further comprising:
third and fourth transistors of the second circuit, wherein the third and fourth transistors of the second circuit are arranged in the second cell row and coupled in parallel with second and third transistors in the plurality of first transistors between an output terminal of the first circuit and a third terminal of the first circuit.

3. The integrated circuit of claim 2, wherein the third and fourth transistors are duplication of the second and third transistors of the plurality of first transistors regarding functionality.

4. The integrated circuit of claim 1, further comprising:
a third transistor of the second circuit, wherein the third transistor of the second circuit is coupled in parallel with a second transistor in the plurality of first transistors between third and fourth terminals of the first circuit, and arranged in a third cell row having the second number of fin structures,
wherein the third transistor of the second circuit and the second transistor in the plurality of first transistors share a second gate extending in the first direction to pass through the first and third cell rows in the layout view.

5. The integrated circuit of claim 4, wherein the second and third transistors of the second circuit have different conductivity types.

6. The integrated circuit of claim 4, wherein a cell height of the first cell row is different from cell heights of the second and third cell rows.

7. The integrated circuit of claim 1, wherein a cell height of the first cell row is greater than a cell height of the second cell row.

8. The integrated circuit of claim 1, further comprising:
a third transistor of the second circuit arranged in a third cell row and coupled between third and fourth terminals of the first circuit,
wherein the second and third transistors of the second circuit have different conductivity types,
wherein the second and third cell rows are arranged on opposite sides of the first cell row.

9. The integrated circuit of claim 8, wherein the third transistor of the second circuit and a second transistor of the plurality of first transistors are coupled in parallel between the third and fourth terminals of the first circuit and configured to receive a control signal at gates thereof.

10. An integrated circuit, comprising:
a plurality of first transistors of a first circuit arranged in a first cell row having a first number of fin structures in a first cell height; and
a second transistor of a second circuit, wherein a first terminal of the second transistor of the second circuit is coupled to a first terminal of a first transistor in the plurality of first transistors, a second terminal of the second transistor of the second circuit is coupled to a second terminal of the first transistor in the plurality of first transistors, and gate terminals of the second transistor of the second circuit and the first transistor in the plurality of first transistors are coupled together to receive a first signal, wherein the second transistor of the second circuit is arranged in a second cell row that has a second cell height different from the first cell height and has a second number smaller than the first number of fin structures,
wherein the second transistor of the second circuit and the first transistor in the plurality of first transistors are configured to generate, in response to the first signal, a second signal at the first terminals of the first transistor in the plurality of first transistors and the second transistor of the second circuit.

11. The integrated circuit of claim 10, wherein the first circuit is configured to operate in response to a first control signal and a second control signal, and the second circuit is configured to operate in response to one of the first control signal and the second control signal.

12. The integrated circuit of claim 11, further comprising:
a third transistor of the second circuit, wherein the third transistor of the second circuit is coupled in parallel with a second transistor in the plurality of first transistors between third and fourth terminals of the first circuit, and arranged in a third cell row having the second cell height,
wherein the third transistor of the second circuit is a duplication of the second transistor in the plurality of first transistors.

13. The integrated circuit of claim 10, further comprising:
a plurality of third transistors of the second circuit, wherein the plurality of third transistors of the second circuit are coupled between third and fourth terminals of the first circuit,
wherein a portion of the plurality of first transistors and a portion of the plurality of third transistors that are coupled between two terminals of the second circuit have a same conductivity.

14. The integrated circuit of claim 10, further comprising:
a third transistor of the second circuit, wherein the third transistor is coupled in parallel with a second transistor in the plurality of first transistors between the first terminal and a third terminal of the first circuit, and arranged in the second cell row.

15. The integrated circuit of claim 10, wherein the first cell height is greater than the second cell height.

16. An integrated circuit, comprising:
a plurality of first transistors of a first circuit arranged in a first cell in a first cell row; and
a second transistor of a second circuit in a second cell, wherein a first terminal of the second transistor of the second circuit is coupled to a first terminal of a first transistor in the plurality of first transistors, and a second terminal of the second transistor of the second circuit is coupled to a second terminal of the first transistor in the plurality of first transistors, wherein the second transistor of the second circuit is arranged in a second cell row, wherein the first and second cells that abut each other at a cell boundary of the first cell,
wherein the first transistor in the plurality of first transistors and the second transistor of the second circuit have gate terminals coupled together to receive a first signal, and share a first gate extending in a first direction to pass through the cell boundary of the first cell in a layout view,
wherein the second transistor of the second circuit and the first transistor in the plurality of first transistors are configured to generate, in response to the first signal, a second signal at the first terminals of the first transistor in the plurality of first transistors and the second transistor of the second circuit.

17. The integrated circuit of claim 16, further comprising:
a third transistor of the second circuit arranged in a third cell row and coupled between third and fourth terminals of the first circuit,
wherein the second and third transistors of the second circuit have different conductivity types.

18. The integrated circuit of claim 17, wherein the second and third cell rows are arranged on opposite sides of the first cell row.

19. The integrated circuit of claim 16, wherein the second transistor is a duplication of the first transistor in the plurality of first transistors.

20. The integrated circuit of claim 16, further comprising:
third and fourth transistors of the second circuit, wherein the third and fourth transistors of the second circuit are arranged in the second cell row and coupled in parallel with second and third transistors in the plurality of first transistors between an output terminal of the first circuit and a third terminal of the first circuit.

* * * * *